US012476656B2

(12) United States Patent
Li et al.

(10) Patent No.: US 12,476,656 B2
(45) Date of Patent: Nov. 18, 2025

(54) ENCODING AND DECODING METHOD AND APPARATUS

(71) Applicant: HUAWEI TECHNOLOGIES CO., LTD., Guangdong (CN)

(72) Inventors: Bin Li, Shenzhen (CN); Jiaqi Gu, Shenzhen (CN); Huazi Zhang, Hangzhou (CN); Shengchen Dai, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 83 days.

(21) Appl. No.: 18/463,404

(22) Filed: Sep. 8, 2023

(65) Prior Publication Data

US 2024/0030941 A1 Jan. 25, 2024

Related U.S. Application Data

(63) Continuation of application No. PCT/CN2022/079571, filed on Mar. 7, 2022.

(30) Foreign Application Priority Data

Mar. 10, 2021 (CN) .......................... 202110260804.5

(51) Int. Cl.
*H03M 13/27* (2006.01)
*H03M 13/00* (2006.01)

(52) U.S. Cl.
CPC ......... *H03M 13/27* (2013.01); *H03M 13/616* (2013.01)

(58) Field of Classification Search
CPC .......................... H03M 13/27; H03M 13/616
See application file for complete search history.

(56) References Cited

U.S. PATENT DOCUMENTS

| 11,258,463 | B2 * | 2/2022 | Luo ..................... H03M 13/616 |
| 2008/0055122 | A1 * | 3/2008 | Tan ................... H03M 13/2957 |
| | | | 341/52 |
| 2019/0158226 | A1 * | 5/2019 | Hui ....................... H04L 1/0041 |
| 2020/0067536 | A1 * | 2/2020 | Luo ....................... H04L 1/0061 |
| 2020/0119846 | A1 * | 4/2020 | Wang .................... H04L 1/0071 |

FOREIGN PATENT DOCUMENTS

| CN | 101371448 A | 2/2009 |
| CN | 108809500 A | 11/2018 |
| CN | 112448724 A | 3/2021 |
| WO | WO-2008059160 A2 * | 5/2008 ........ H03M 13/1137 |

OTHER PUBLICATIONS

International Search Report and Written Opinion issued in PCT/CN2022/079571, dated May 19, 2022, 10 pages.

* cited by examiner

*Primary Examiner* — Robert W Beausoliel, Jr.

(57) ABSTRACT

An encoding apparatus may obtain a to-be-encoded sequence, where the to-be-encoded sequence includes information bits and fixed bits, and the information bits and the fixed bits are determined based on reliability and/or row weights of generator matrices corresponding to the to-be-encoded bits; and perform a encoding process on the to-be-encoded sequence to obtain an encoded sequence, where the encoding process includes at least one interleaving process.

20 Claims, 9 Drawing Sheets

ENCODING AND DECODING METHOD AND APPARATUS

CROSS-REFERENCE TO RELATED APPLICATIONS

This application is a continuation of International Application No. PCT/CN2022/079571, filed on Mar. 7, 2022, which claims priority to Chinese Patent Application No. 202110260804.5, filed on Mar. 10, 2021. The disclosures of the aforementioned applications are hereby incorporated by reference in their entireties.

TECHNICAL FIELD

Embodiments of the present application relate to the communication field, and more specifically, to an encoding and decoding method and apparatus.

BACKGROUND

Communication systems usually adopt channel encoding to improve reliability of data transmission and ensure quality of communication. A polar code is the first channel encoding scheme that theoretically proves that a Shannon capacity may be obtained, and has characteristics of high performance, low complexity, and flexible matching manner. At present, the polar code has been determined by the 3rd generation partnership project (3GPP) as an uplink and downlink control channel encoding scheme for a 5th generation (5G) control channel in an enhanced mobile broadband (eMBB) scenario. However, when a polar code has a relatively short code length, performance of a code spectrum is poor.

Based on the polar code, Arikan proposed a polarization-adjusted convolutional code (PAC) encoding scheme in 2019. This scheme can guarantee the performance of the code spectrum even when the code length is short. However, a Fano decoding algorithm adopted by Arikan for the PAC is complex and unfriendly to hardware implementation.

Therefore, it is urgent to provide an encoding scheme that can improve the performance of the code spectrum and decoding performance.

SUMMARY

The present application provides an encoding and decoding method and apparatus, to optimize a code spectrum and improve decoding performance.

According to a first aspect, an encoding method is provided, and the encoding method includes: obtaining a to-be-encoded sequence, where the to-be-encoded sequence includes information bits and fixed bits, and the information bits and the fixed bits are determined based on reliability and/or row weights of generator matrices corresponding to the to-be-encoded bits; and performing encoding on the to-be-encoded sequence to obtain an encoded sequence, where an encoding process of the encoding includes at least one interleaving.

In a possible implementation, the encoding method further includes sending the encoded sequence.

According to the encoding method in this embodiment, the information bits and the fixed bits in the to-be-encoded bits are determined based on reliability and/or the row weights of the generator matrices corresponding to the to-be-encoded bits. The information bits are used to carry target information, the fixed bits are used to carry a pre-agreed fixed value by a receive end and a transmit end, so as to obtain the to-be-encoded sequence. The information bits in the to-be-encoded sequence correspond to the information bits in the to-be-encoded bits, and the fixed bits in the to-be-encoded sequence correspond to the fixed bits in the to-be-encoded bits. Then, the to-be-encoded sequence is performed encoding, and at least one interleaving is inserted in an encoding process of the to-be-encoded sequence, or interleaving is inserted in at least one intermediate stage in an encoding process of the to-be-encoded sequence. The interleaving includes interleaving by using at least one interleaver. The simulation results show that the encoding method may significantly reduce a quantity of codewords at a minimum code distance without reducing the minimum code distance, optimize the code spectrum and improve performance of the code.

It should be noted that, these fixed bits may be set to 0, and the setting is also used in the description of the present application. In some possible implementations, a fixed bit sequence may be further set to a value agreed upon in advance by the transmit end and the receive end.

In a possible implementation, the encoding method in this embodiment may be applied to polar code encoding or Reed-Muller (RM) code encoding. It may be understood that after a to-be-encoded sequence is obtained, an encoding manner of polar code encoding or RM code encoding is used for the to-be-encoded sequence, one interleaving is added to at least one intermediate encoding stage of polar code encoding or RM code encoding, and the interleaving includes interleaving by using at least one interleaver.

It should be noted that, the encoding method is further applied to another encoding manner of concatenated outer codes. For example, the outer codes may be BCH (Bose-Chaudhuri-Hocquenghem codes) encoding, or low density parity check (LDPC) codes. The present application should not be limited herein.

With reference to the first aspect, in some implementations of the first aspect, that the encoding process of the encoding includes at least one interleaving includes: performing first encoding on the to-be-encoded sequence to obtain Q first encoded sequences, where Q is a positive integer; performing first interleaving on at least one of the Q first encoded sequences to obtain Q second encoded sequences; and performing second encoding on the Q second encoded sequences to obtain an encoded sequence.

In a possible implementation, the encoding process includes: performing first encoding on the to-be-encoded sequence to obtain Q first encoded sequences denoted as $\{C_1^{(0)}, C_2^{(0)}, \ldots, C_k^{(0)}, \ldots, C_Q^{(0)}\}$, where k and Q are positive integers; performing first interleaving on Q/2 first encoded sequences $\{C_1^{(0)}, C_3^{(0)}, \ldots, C_{2k-1}^{(0)}, \ldots, C_{Q-1}^{(0)}\}$ in the Q first encoded sequences to obtain Q second encoded sequences denoted as $\{I_1^{(1)}(C_1^{(0)}), C_2, \ldots, I_k^{(1)}(C_{2k-1}^{(0)}), C_{2k}, \ldots, I_{Q/2}^{(1)}(C_{Q-1}^{(0)}), C_Q\}$, where $I_k^{(1)}$ indicates to perform first interleaving on the $k^{th}$ first encoded sequence in the Q first encoded sequences; and performing second encoding on the Q second encoded sequences to obtain an encoded sequence.

In a possible implementation, the first encoding includes: performing equivalent grouping on the to-be-encoded sequence, equivalently treating the to-be-encoded sequence as Q groups of to-be-encoded sub-sequences, and performing an encoding process before first interleaving on the Q groups of to-be-encoded sub-sequences. In a possible implementation, the encoding process before the first interleaving may further include one or more times of interleaving.

In a possible implementation, equivalent grouping is performed on the to-be-encoded sequence based on a preset quantity m of times of interleaving.

For example, when first interleaving is the first interleaving, an encoding method of RM encoding is used as an example. If an interleaver corresponding to the first interleaving is inserted after a first stage before a second stage in the RM code encoding process, the first encoding, that is, the encoding process before the first interleaving, refers to encoding of the first stage in the RM code encoding process. When first interleaving is a non-first interleaving, if the interleaver is inserted in the first interleaving after a second stage before a third stage in the RM code encoding process, the first encoding, that is the encoding process before the first interleaving, refers to encoding in the second stage and a stage before the second stage in a process of RM code encoding for the Q groups of to-be-encoded sub-sequences, and an interleaving operation is included in the encoding process in the second stage and the stage before the second stage.

It should be noted that, description of performing "equivalent grouping" on the to-be-encoded sequence in the foregoing first encoding is merely for ease of description and understanding. Actually, a grouping operation is not necessarily performed on the to-be-encoded sequence. The present application should not be limited herein. Similarly, an encoding process (for example, a polar code encoding process or an RM code encoding process) before the first interleaving may be first performed on the to-be-encoded sequence, and then intermediate encoding results obtained after the encoding process are performed equivalent grouping to obtain Q first encoded sequences.

With reference to the first aspect, in some implementations of the first aspect, the encoding process further includes: performing third encoding on the Q second encoded sequences to obtain P third encoded sequences, where both P and Q are positive integers; performing second interleaving on at least one of the P third encoded sequences to obtain P fourth encoded sequences; and performing fourth encoding on the P fourth encoded sequences to obtain an encoded sequence.

In a possible implementation, the second encoding includes performing next-stage encoding on the Q interleaved second encoded sequences. As an example rather than a limitation, an encoding method of RM encoding is used as an example. The interleaver is added after the second stage and before the third stage in the RM encoding process, and the second encoding includes performing the RM encoding in the third stage on Q second encoded sequences obtained after an interleaving operation performed by the interleaver.

According to the encoding method in this embodiment, an interleaver is inserted in an encoding process of a to-be-encoded sequence, so that a quantity of codewords at a minimum code distance can be significantly reduced without reducing the minimum code distance, a code spectrum is optimized, and performance of the code is improved.

With reference to the first aspect, in some implementations of the first aspect, the encoding process includes: performing first encoding on the to-be-encoded sequence to obtain Q first encoded sequences denoted as $\{C_1^{(0)}, C_2^{(0)}, \ldots, C_k^{(0)}, \ldots, C_Q^{(0)}\}$; performing first interleaving on Q/2 first encoded sequences $\{C_1^{(0)}, C_3^{(0)}, \ldots, C_{2k-1}^{(0)}, \ldots, C_{Q-1}^{(0)}\}$ in the Q first encoded sequences to obtain Q second encoded sequences denoted as $\{I_1^{(1)}(C_1^{(0)}), C_2, \ldots, I_k^{(1)}(C_{2k-1}^{(0)}), C_{2k}, \ldots, I_{Q/2}^{(1)}(C_{Q-1}^{(0)}), C_Q\}$, where $I_k^{(1)}$ indicates to perform first interleaving on the $k^{th}$ first encoded sequence in the Q first encoded sequences; performing third encoding on the Q second encoded sequences to obtain P third encoded sequences denoted as $\{C_1^{(1)}, C_2^{(1)}, \ldots, C_k^{(1)}, \ldots, C_P^{(1)}\}$, where k, P, and Q are all positive integers, and $C_k^{(1)} = [I_k^{(1)}(C_{2k-1}^{(0)} + C_{2k}^{(0)}, C_{2k}^{(0)}]$; performing second interleaving on P/2 third encoded sequences $\{C_1^{(1)}, C_3^{(1)}, \ldots, C_{2k-1}^{(1)}, \ldots, C_{Q-1}^{(1)}\}$ in the P third encoded sequences to obtain P fourth encoded sequences; and performing fourth encoding on the P fourth encoded sequences to obtain an encoded sequence.

It should be noted that, in the foregoing implementation, if sequence numbers of the first encoded sequence and the third encoded sequence are sorted starting from 0, it is equivalent to perform interleaving on encoded sequences whose sequence numbers are even numbers in the first encoded sequence and the third encoded sequence.

According to the encoding method in this embodiment, compared with a traditional RM code encoding method or a polar code encoding method, in a case that a code length is relatively short, a quantity of codewords at a minimum code distance can be reduced, and performance of the code spectrum can be improved.

It should be understood that the minimum code distance is an important parameter of a code, and is a basis for measuring an error detection and error correction capability of a code. A smaller quantity of codewords at the minimum code distance indicates a stronger error detection and error correction capability of a corresponding code, and better performance of the code.

With reference to the first aspect, in some implementations of the first aspect, row weights of generator matrices corresponding to the information bits are greater than or equal to row weights of generator matrices corresponding to the fixed bits.

In a possible implementation, information bits and fixed bits are selected for the to-be-encoded bits based on the row weights of the generator matrices. Assuming that K bits need to be selected as the information bits, a row weight of a generator matrix G corresponding to each to-be-encoded bit is first calculated. Then, the to-be-encoded bits are sorted based on a descending order of row weights of the generator matrices or an ascending order of row weights of the generator matrices. Assuming that K bits need to be selected as the information bits. If the to-be-encoded bits are sorted in descending order of the row weights of the generator matrices, first K bits are selected as the information bits, and the other bits are used as the fixed bits. Similarly, if the to-be-encoded bits are sorted in ascending order of the row weights of the generator matrices, last K bits are selected as the information bits, and the other bits are used as the fixed bits. A quantity K of the information bits may be preset.

With reference to the first aspect, in some implementations of the first aspect, reliability corresponding to the information bits is greater than or equal to a preset reliability threshold.

In a possible implementation, information bits and fixed bits are selected based on reliability for the to-be-encoded bits. Assuming that K bits need to be selected as the information bits, reliability of a sub-channel corresponding to each to-be-encoded bit is first calculated. Then, the to-be-encoded bits are sorted in descending order of reliability or in ascending order of reliability. Assuming that K bits need to be selected as the information bits. If the to-be-encoded bits are sorted in descending order of reliability, first K bits are selected as the information bits, and the other bits are used as the fixed bits. Similarly, if the to-be-encoded bits are sorted in ascending order of reliability, last K bits are selected as the information bits, and the other bits are used as the fixed bits. A quantity K of the information bits may be preset.

It should be noted that, when determining reliability of a sub-channel corresponding to each to-be-encoded bit, that is, which are reliable channels and which are unreliable channels, and a method for measuring reliability of each sub-channel includes but is not limited to: a bhattacharyya parameter method, a density evolution (DE) method, and a gaussian approximation method.

With reference to the first aspect, in some implementations of the first aspect, row weights of generator matrices corresponding to the information bits are greater than or equal to row weights of generator matrices corresponding to the fixed bits, and reliability corresponding to the information bits is greater than a preset reliability threshold.

In a possible implementation, assuming that K bits need to be selected as information bits, and to-be-encoded bits whose row weights of generator matrices are greater than a preset row weight threshold are selected. Reliability corresponding to to-be-encoded bits whose row weights of the generator matrices are greater than a preset row weight threshold are determined, and the bits whose row weights of generator matrices are greater than the preset row weight threshold in descending order of reliability (or ascending order of reliability) are sorted. If sorting is performed in descending order of the reliability, first K bits are selected as the information bits, and other bits in the to-be-encoded bits are used as the fixed bits. Similarly, if sorting is performed in ascending order of the reliability, last K bits are selected as the information bits, and the other bits in the to-be-encoded bits are used as the fixed bits. A quantity K of the information bits may be preset.

In a possible implementation, to-be-encoded bits whose row weights of generator matrices are greater than a preset row weight threshold may be selected by calculating a row weight of a generator matrix G corresponding to each to-be-encoded bit, sorting the to-be-encoded bits in descending order of the row weights (or in ascending order of the row weights) of the generator matrices, selecting M to-be-encoded bits based on the preset row weight threshold or a sequence number of the row weight corresponding to each to-be-encoded bit, and selecting K information bits from the M to-be-encoded bits based on a sequence number of reliability corresponding to each to-be-encoded bit. M is greater than or equal to K, and both M and K are positive integers.

With reference to the first aspect, in some implementations of the first aspect, reliability of the information bits is greater than or equal to reliability of the fixed bits, and row weights of generator matrices corresponding to the information bits is greater than a preset row weight threshold.

In a possible implementation, assuming that K bits need to be selected as information bits, and to-be-encoded bits whose reliability is greater than a preset reliability threshold are selected. A row weight of a generator matrix G corresponding to a to-be-encoded bit whose reliability is greater than a preset reliability threshold is determined, and the bits whose reliability is greater than the preset reliability threshold in descending order (or ascending order) of row weights of generator matrices are sorted. If sorting is performed in descending order of the row weights of the generator matrices, first K bits are selected as the information bits, and the other bits in the to-be-encoded bits are used as the fixed bits. Similarly, if sorting is performed in ascending order of the row weights of the generator matrices, last K bits are selected as the information bits, and the other bits in the to-be-encoded bits are used as the fixed bits. A quantity K of the information bits may be preset.

In a possible implementation, to-be-encoded bits whose reliability is greater than a preset reliability threshold may be selected by calculating reliability corresponding to each to-be-encoded bit, sorting the to-be-encoded bits in descending order of the reliability (or in ascending order of the reliability), selecting M to-be-encoded bits based on a preset reliability threshold or a sequence number of the reliability corresponding to each to-be-encoded bit, and then selecting K information bits from the M to-be-encoded bits based on a sequence number of a row weight of a generator matrix corresponding to each to-be-encoded bit. M is greater than or equal to K, and both M and K are positive integers.

It should be further noted that, when the information bits are selected, specific values of the row weights corresponding to the to-be-encoded bits and/or a specific value of the reliability corresponding to the to-be-encoded bits are compared. Correspondingly, the preset row weight threshold and the preset reliability threshold are also specific values. For example, a specific value corresponding to the reliability or the preset reliability threshold may be an error probability value of the sub-channel corresponding to the bit that is calculated according to a Gaussian approximation method. However, when information bit selection is performed on to-be-encoded bits sorted according to a specific rule, first K bits or last K bits are selected as the information bits based on the sequence number.

In another possible implementation, the to-be-encoded bits are sorted in advance in descending order (or ascending order) of row weights of corresponding generator matrices or in descending order (or ascending order) of reliability, and a sorting result is stored. Subsequently, information bits or fixed bits in the to-be-encoded bits may be determined by querying the stored information. For example, K bits need to be selected as the information bits, and the stored information is queried. K bits that are ranked top of the row weights (sorted in descending order of the row weights) or ranked top of the reliability (sorted in descending order of the reliability) are used as the information bits.

According to the encoding method in this embodiment, a selection manner of the information bits is combined with interleaver insertion. Compared with a conventional encoding method, a quantity of codewords at a minimum code distance is greatly reduced, a code spectrum is optimized, and performance of the code is improved. In addition, as a quantity m of times of interleaving increases in the encoding process, the quantity of codewords at the minimum code distance corresponding to the encoding method in the present application is further reduced, and an improvement effect of the performance of the code is more obvious.

According to a second aspect, a decoding method is provided, and the decoding method includes: receiving a to-be-decoded sequence; and performing decoding on the to-be-decoded sequence to obtain a decoded sequence, where a decoding process of the decoding includes at least one de-interleaving.

The decoding method in this embodiment of the present application corresponds to the encoding method in the present application. In other words, a decoder side knows an encoding structure of an encoder side in advance. Corresponding to the interleaver inserted in the encoding method in the present application, a de-interleaving operation is correspondingly performed in a decoding process. Another decoding method that does not involve an interleaver is similar to a decoding method in a conventional technology. For example, reference may be made to an SC decoding algorithm, an SCL decoding algorithm, an SCS decoding algorithm, and an SCH decoding algorithm. Alternatively, CRC information may be added to an information sequence, and an enhanced SC decoding algorithm assisted by a CRC is used, such as a CASCL decoding algorithm, a CASCS decoding algorithm, and a CASCH decoding algorithm.

Compared with a Fano decoding algorithm used by Arikan for the PAC, the decoding method in this embodiment has lower complexity and is easier to implement.

With reference to the second aspect, in some implementations of the second aspect, that a decoding process of the decoding includes at least one de-interleaving includes: performing first decoding on a to-be-decoded sequence to obtain a first sub-sequence; performing first de-interleaving on the first sub-sequence to obtain a second sub-sequence; and performing second decoding on the second sub-sequence to obtain the decoded sequence. In a possible implementation, an decoding process before the first de-interleaving may further include one or more times of de-interleaving.

When first de-interleaving is first de-interleaving, the first decoding includes a decoding process before the first de-interleaving, and no interleaver is involved in the decoding process. Reference may be made to a decoding process in a conventional technology herein, and details are not described herein again. When first de-interleaving is non-first de-interleaving, the first decoding includes a decoding process before the de-interleaving, and the decoding process includes a de-interleaving operation before the de-interleaving. For another decoding process in the decoding process that does not involve an interleaver, refer to a decoding process in the conventional technology. Details are not described herein again.

It should be noted that, the decoding method in the present application may be understood as follows: Based on the decoding method in the conventional technology, the decoding method corresponds to the encoding method in the present application. In other words, when decoding reaches a position at which an interleaver is added in the encoding method in the present application, a de-interleaving operation is correspondingly performed. For another decoding process that does not involve an interleaver, refer to a decoding process in the conventional technology. Details are not described herein again.

With reference to the second aspect, in some implementations of the second aspect, the second decoding includes: performing third decoding on the second sub-sequence to obtain a third sub-sequence; performing second de-interleaving on the third sub-sequence to obtain a fourth sub-sequence; and performing fourth decoding on the fourth sub-sequence to obtain the decoded sequence.

In a possible implementation, the second decoding includes a decoding process intermediate between the first de-interleaving and the second de-interleaving, that is, a decoding process between two times of de-interleaving. Reference may be made to the conventional technology herein, and details are not described herein again.

It should be noted that, if the decoding mode used in the present application includes some operations of performing reverse encoding on a decoded current decoding result, the decoding process in the present application may further include an interleaving operation. Specifically, the first decoding and the second decoding may further include an interleaving operation. For example, in a process of solving a current sub-sequence in a current decoding stage, reverse encoding needs to be performed on a decoding result of a previous sub-sequence in a same stage, and an interleaver is inserted before a position corresponding to the previous sub-sequence in the encoding process. In this case, the performing a reverse encoding operation on the current decoding result of the previous sub-sequence that has been decoded further includes an interleaving operation. It should be understood that a decoding process that does not involve an interleaver in the foregoing decoding process is similar to that in a conventional technology. In a decoding process that involves an interleaver, a de-interleaving operation is performed when a corresponding forward decoding encounters an interleaver, and an interleaving operation is performed when a corresponding reverse encoding encounters an interleaver.

Corresponding to an interleaver added in an encoding process, the decoding method in this embodiment correspondingly performs a de-interleaving operation. In addition, as a quantity m of times of de-interleaving increases, a quantity of codewords with a minimum code distance corresponding to the decoding method in the present application gradually reduces, and performance of the code spectrum is improved. Performance of a code generated by using the encoding method provided in the present application is equivalent to or even better than performance of a code generated by using the PAC encoding method. In addition, compared with Fano decoding used for the PAC, a decoding method corresponding to the encoding method in the present application has lower complexity and less difficulty in implementation.

According to a third aspect, an encoding apparatus is provided. The apparatus may be configured to perform an operation of a communication device in the first aspect and any possible implementation of the first aspect. Specifically, the communication apparatus includes corresponding means configured to perform the steps or functions described in the first aspect. The corresponding means may be the first communication device in the first aspect. The steps or functions may be implemented by using software, or implemented by using hardware, or implemented by using a combination of hardware and software.

For example, the encoding apparatus includes: a determining unit, configured to obtain a to-be-encoded sequence, where the to-be-encoded sequence is determined based on reliability corresponding to to-be-encoded bits and/or row weight of generator matrices, and the to-be-encoded bits include information bits and fixed bits; and an encoding unit, configured to perform encoding on the to-be-encoded sequence to obtain an encoded sequence, where an encoding process of the encoding includes at least one interleaving.

With reference to the third aspect, in some implementations of the third aspect, the encoding apparatus further includes a transceiver unit, configured to send the encoded sequence.

With reference to the third aspect, in some implementations of the third aspect, the encoding unit is configured to: perform first encoding on the to-be-encoded sequence to obtain Q first encoded sequences, where Q is a positive integer; perform first interleaving on at least one of the Q first encoded sequences to obtain Q second encoded sequences; and perform second encoding on the Q second encoded sequences to obtain an encoded sequence.

With reference to the third aspect, in some implementations of the third aspect, that the encoding unit is configured to perform second encoding on the Q second encoding sequences includes that the encoding unit is configured to: perform third encoding on the Q second encoded sequences to obtain P third encoded sequences, where both P and Q are positive integers; perform second interleaving on at least one of the P third encoded sequences to obtain P fourth encoded sequences; and perform fourth encoding on the P fourth encoded sequences to obtain an encoded sequence.

With reference to the third aspect, in some implementations of the third aspect, the encoding unit is configured to: perform the first encoding on the to-be-encoded sequence to obtain Q first encoded sequences denoted as $\{C_1^{(0)}, C_2^{(0)}, \ldots, C_k^{(0)}, \ldots, C_Q^{(0)}\}$; perform first interleaving on Q/2 first encoded sequences $\{C_1^{(0)}, C_3^{(0)}, \ldots, C_{2k-1}^{(0)}, \ldots, C_{Q-1}^{(0)}\}$ in the Q first encoded sequences to obtain Q second encoded sequences $\{I_1^{(1)}(C_1^{(0)}), C_2, \ldots, I_k^{(1)}(C_{2k-1}^{(0)}), C_{2k}, \ldots, I_{Q/2}^{(1)}(C_{Q-1}^{(0)}), C_Q\}$, where $I_k^{(1)}$ indicates to perform first interleaving on a $k^{th}$ first encoded sequence in the Q first encoded sequences; perform third encoding on the Q second encoded sequences to obtain P third encoded sequences $\{C_1^{(1)}, C_2^{(1)}, \ldots, C_k^{(1)}, \ldots, C_P^{(1)}\}$, k, P, and Q are all positive integers, where $C_k^{(1)} = [I_k^{(1)}(C_{2k-1}^{(0)}) + C_{2k}^{(0)}, C_{2k}^{(0)}]$; perform second interleaving on P/2 third encoded sequences $\{C_1^{(1)}, C_3^{(1)}, \ldots, C_{2k-1}^{(1)}, \ldots, C_{Q-1}^{(1)}\}$ in the P third encoded sequences to obtain P fourth encoded sequences; and perform fourth encoding on the P fourth encoded sequences to obtain an encoded sequence.

For beneficial effects of the encoding apparatus provided in the third aspect, refer to beneficial effects of the first aspect and various possible implementations of the first aspect. Details are not described herein again.

According to a fourth aspect, a decoding apparatus is provided. The apparatus may be configured to perform an operation of a communication device in the second aspect or any possible implementation of the second aspect. Specifically, the apparatus may include means corresponding to the steps or functions described in the second aspect. The steps or functions may be implemented by using software, or implemented by using hardware, or implemented by using a combination of hardware and software.

For example, the decoding apparatus includes: a transceiver unit, configured to receive a to-be-decoded sequence; and a decoding unit, configured to decode the to-be-decoded sequence to obtain a decoded sequence, where a decoding process of the decoding includes at least one de-interleaving.

With reference to the fourth aspect, in some implementations of the fourth aspect, the decoding unit is configured to perform first decoding on a to-be-decoded sequence to obtain a first sub-sequence; perform first de-interleaving on the first sub-sequence to obtain a second sub-sequence; and perform second decoding on the second sub-sequence to obtain the decoded sequence. In a possible implementation, andecoding process before the first de-interleaving may further include one or more times of de-interleaving.

With reference to the fourth aspect, in some implementations of the fourth aspect, the second decoding includes: performing third decoding on the second sub-sequence to obtain a third sub-sequence; performing second de-interleaving on the third sub-sequence to obtain a fourth sub-sequence; and performing fourth decoding on the fourth sub-sequence to obtain the decoded sequence.

For beneficial effects of the encoding apparatus provided in the fourth aspect, refer to beneficial effects of the second aspect and various possible implementations of the second aspect. Details are not described herein again.

According to a fifth aspect, a computer-readable medium is provided. The computer-readable medium stores a computer program (which may also be referred to as code or an instruction). When the computer program runs on a computer, so that the method according to any one of the first aspect and the possible implementations of the first aspect is performed; or the method according to any one of the second aspect and the possible implementations of the second aspect is performed.

According to a sixth aspect, a chip system is provided, including a memory and a processor. The memory is configured to store a computer program, and the processor is configured to invoke the computer program from the memory and run the computer program, so that a communication device installed with the chip system performs the method according to any one of the first aspect and the possible implementations of the first aspect; or perform the method according to any one of the second aspect and the possible implementations of the second aspect.

According to a seventh aspect, a chip is provided. The chip includes a processor and a communication interface, the communication interface is configured to communicate with an external component or an internal component, and the processor is configured to implement the method according to any one of the first aspect and the possible implementations of the first aspect; or the processor is configured to implement the method according to any one of the second aspect and the possible implementations of the second aspect.

In a possible implementation, the chip may further include a memory. The memory stores an instruction, and the processor is configured to perform the instruction stored in the memory or another instruction. When the instruction is performed, the processor is configured to implement the method according to any one of the first aspect and the possible implementations of the first aspect; or the processor is configured to implement the method according to any one of the second aspect and the possible implementations of the second aspect.

According to an eighth aspect, a computer program product is provided. The computer program product includes: a computer program (which may also be referred to as code or an instruction). When the computer program is run, the computer is enabled to perform the method according to any one of the first aspect and the possible implementations of the first aspect; or perform the method according to any one of the second aspect and the possible implementations of the second aspect.

According to a ninth aspect, a communication device is provided, including a processor and a memory. The memory is configured to store a computer program, and the processor is configured to invoke the computer program from the memory and run the computer program, so that the communication apparatus performs the communication method according to any one of the first aspect and the possible implementations of the first aspect, or perform the communication method according to any one of the second aspect and the possible implementations of the second aspect.

There are one or more processors, and there are one or more memories. The memory may be integrated with the processor, or the memory may be disposed separately from the processor.

In a possible design, a communication device is provided, including a communication interface, a processor, and a memory. The processor is configured to control the communication interface to receive and send a signal, the memory is configured to store a computer program, and the processor is configured to invoke the computer program from the memory and run the computer program, so that the communication device performs the method according to any one of the first aspect and the possible implementations of the first aspect, or perform the method according to any one of the second aspect and the possible implementations of the second aspect.

According to a tenth aspect, a communication apparatus is provided, including: an input/output interface and a logic circuit. The input/output interface is configured to obtain a to-be-encoded sequence, the input/output interface is further configured to send an encoded sequence, and the logic circuit is configured to perform encoding on the to-be-encoded sequence based on the method according to any one of the first aspect and the possible implementations of the first aspect, to obtain an encoded sequence.

According to an eleventh aspect, a communication apparatus is provided, including: an input/output interface and a logic circuit. The input/output interface is configured to obtain a to-be-decoded sequence, and the logic circuit is configured to perform encoding on the to-be-decoded sequence based on the method according to any one of the second aspect and the possible implementations of the second aspect, to obtain a decoded sequence.

According to a twelfth aspect, a system is provided. The system includes the encoding apparatus in the third aspect and the decoding apparatus in the fourth aspect.

DESCRIPTION OF EMBODIMENTS

The following describes technical solutions of the present application with reference to the accompanying drawings.

The technical solutions in embodiments of the present application may be applied to various communication systems, for example, a long term evolution (LTE) system, an LTE frequency division duplex (FDD) system, an LTE time division duplex (TDD), a fifth generation (5G) system, a new radio (NR), or a new communication system that may appear in the future, such as a sixth generation (6G).

An encoding method or a decoding method in this embodiment may be performed by a terminal device. The terminal device may refer to user equipment (UE), an access terminal, a subscriber unit, a subscriber station, a mobile station, a remote station, a remote terminal, a mobile device, a user terminal (terminal equipment), a terminal, a wireless communication device, a user agent, or a user apparatus. The terminal device may also be a cellular phone, a cordless phone, a session initiation protocol (SIP) phone, a wireless local loop (WLL) station, a personal digital assistant (PDA), a handheld device and a computing device both having a wireless communication function, or another processing device connected to a wireless modem, an in-vehicle device, a wearable device, a virtual reality (VR) terminal device, an augmented reality (AR) terminal device, a wireless terminal in industrial control, a wireless terminal in self driving, a wireless terminal in remote medical, a wireless terminal in smart grid, a wireless terminal in transportation safety, a wireless terminal in a smart city, a wireless terminal in a smart home, a terminal in satellite communication, a terminal device in a 5G network or in a future communication network. This is not limited in embodiments of the present application.

Alternatively, an encoding method or a decoding method in this embodiment may be performed by a network device. The network device may be a device configured to communicate with a terminal device. The network device may be an evolutional NodeB (eNB, or eNodeB) in an LTE system, or may be a radio controller in a cloud radio access network (CRAN) scenario, or the network device may be a relay station, an access point, an in-vehicle device, a wearable device, a next-generation base station (gNodeB, gNB) in 5G networks, a transmitting and receiving point (TRP), a transmitting point (TP), a mobile switching center, a device-to-device (D2D), a vehicle-to-everything (V2X), a machine-to-machine (M2M) communication, a device undertaking a base station function in Internet of Things communication, or a network device in a future evolved network. This is not limited in embodiments of the present application.

Figure 1:
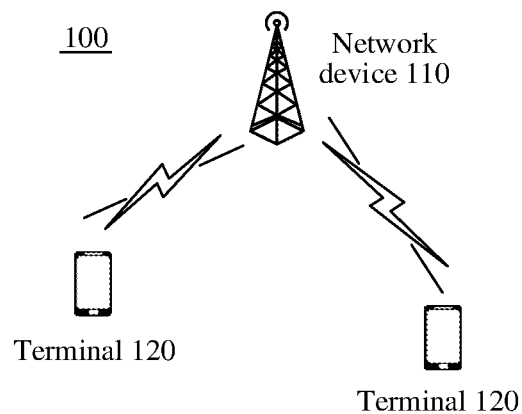
FIG. 1 is a schematic diagram of a system scenario to which an embodiment of the present application can be applied.

FIG. 1 shows a wireless communication system 100 that may be applied according to various embodiments herein. The wireless communication system 100 includes a network device 110, and the network device 110 may communicate with one or more terminal devices (for example, a terminal device 120).

In a given time, the network device 110 and the terminal device 120 may be a wireless communication sending apparatus and/or a wireless communication receiving apparatus. When sending data, the wireless communication sending apparatus may perform encoding on the data for transmission.

Specifically, the wireless communication sending apparatus may obtain (for example, generate, receive from another communication apparatus, or stored in a memory) a particular quantity of data bits to be sent to the wireless communication receiving apparatus through a channel. Such data bits may be included in one or more transport blocks of data, and the transport block may be segmented to generate a plurality of code blocks. In addition, the wireless communication sending apparatus may perform encoding on each code block by using an encoder (not shown in the figure), to generate a transmit signal.

The wireless communication receiving apparatus may receive, by using the channel, a signal that is sent by the wireless communication sending apparatus and that is obtained after encoding processing is performed by the encoder in the present application, and may decode the signal by using a decoder (not shown in the figure) corresponding to the decoding method in the present application, to obtain the data bits.

Figure 2:
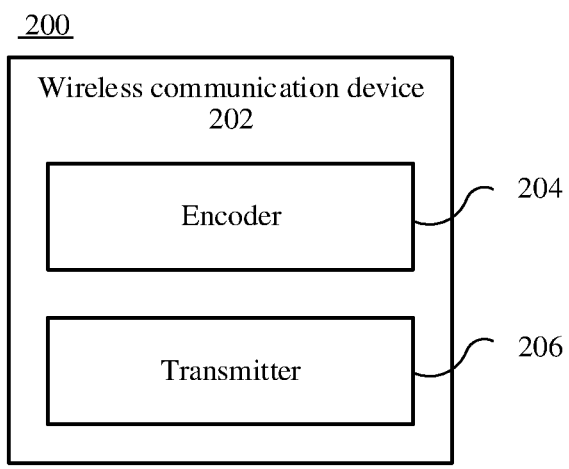
FIG. 2 is a schematic diagram of a system for performing an encoding method in an implementation of the present application in a wireless communication environment.
Figure 3:
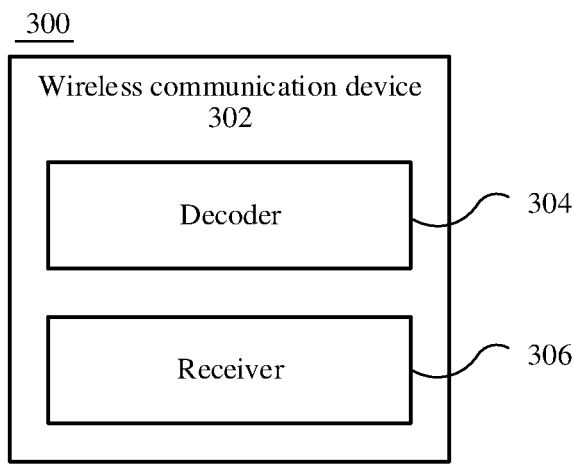
FIG. 3 is a schematic diagram of a system for performing a decoding method in an implementation of the present application in a wireless communication environment.

FIG. 2 and FIG. 3 show systems applicable to an encoding and decoding method of the present application in a wireless communication environment. The system includes a system 200 applicable to an encoding method of the present application and a system 300 applicable to a decoding method of the present application.

FIG. 2 is a schematic block diagram of a system 200 to which an encoding method in the present application is applicable in a wireless communication environment. The system 200 includes a wireless communication device 202, and the wireless communication device 202 may transmit data through a channel. In addition, the wireless communication device 202 may further receive data through the channel. For example, the wireless communication device 202 may send and receive data at the same time, or the wireless communication device 202 may send and receive data at different moments, or a combination thereof. For example, the wireless communication device 202 may be a network device (for example, the network device 110 in FIG. 1), or a terminal device (for example, the terminal device 120 in FIG. 1).

The wireless communication device 202 may include an encoder 204 and a transmitter 206 in the present application. Optionally, the wireless communication device 202 may further include a rate matching apparatus. Optionally, when the wireless communication device 202 receives data through a channel, the wireless communication device 202 may further include a receiver. The receiver may exist alone, or may be integrated with the transmitter 206 to form a transceiver.

The encoder 204 in the present application is configured to perform encoding on data to be transmitted from the wireless communication device 202.

In addition, the transmitter 206 may then transmit, on a channel, output bits after processing by the encoder 204 (or the encoder 204 and the rate matching apparatus in the present application) in the present application. For example, the transmitter 206 may send related data to another different wireless communication apparatus (not shown in the figure).

FIG. 3 shows a schematic block diagram of a system 300 to which a decoding method of the present application is applicable in a wireless communication environment. The system 300 includes a wireless communication device 302, and the wireless communication device 302 may receive data through a channel. In addition, the wireless communication device 302 may further send data through the channel. For example, the wireless communication device 302 may send and receive data at the same time, or the wireless communication device 302 may send and receive data at different moments, or a combination thereof. For example, the wireless communication device 302 may be a network device (for example, the network device 110 in FIG. 1), or a terminal device (for example, the terminal device 120 in FIG. 1).

The wireless communication device 302 may include a receiver 306 and a decoder 304 in the present application. Optionally, when the wireless communication device 302 sends data through a channel, the wireless communication device 302 may further include a transmitter. The transmitter may exist alone, or may be integrated with the receiver 306 to form a transceiver.

The receiver 306 may receive, on a channel, a signal that is transmitted by another wireless communication apparatus and that has undergone encoding processing in the present application.

In addition, the decoder 304 in the present application is configured to decode a signal received by the receiver 306, to obtain data sent by another wireless communication apparatus.

Before a specific embodiment of the present application is described, a basic procedure of performing communication by using a wireless technology is first described.

Figure 4:
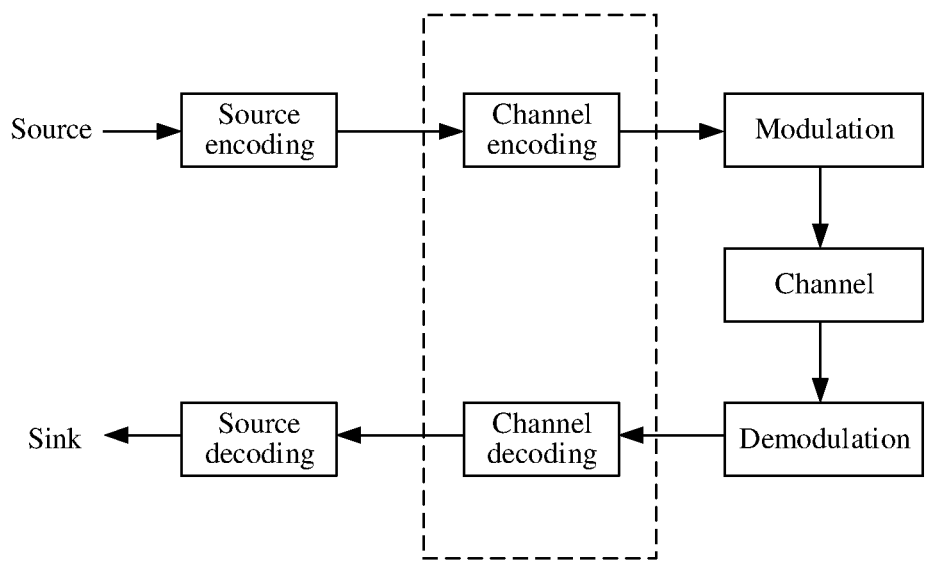
FIG. 4 is a schematic diagram of a basic flowchart of wireless communication.

As shown in FIG. 4, after source encoding, channel encoding, rate matching, and modulation are sequentially performed, a source at a transmit end is sent on a channel. After receiving the signal, a receive end sequentially performs demodulation, rate de-matching, channel decoding, and source decoding to obtain a sink. An apparatus corresponding to an encoding method or a decoding method provided in the present application is located in a channel encoding module and a channel decoding module shown by a dashed box in FIG. 4.

The following describes a polar code encoding and decoding process in the present application.

Communication systems usually adopt channel encoding to improve reliability of data transmission and ensure quality of communication. The polar code proposed by Arikan is the first good code that theoretically proves that Shannon capacity may be obtained and has low encoding and decoding complexity. A core of the polar code is to use "channel polarization". On an encoder side, sub-channels present different levels of reliability by using an encoding method. When a code length continuously increases, some channels tend to become noise-free channels having a capacity close to 1, and other channels tend to become all-noise channels having a capacity close to 0. A channel having a capacity close to 1 is selected to directly transmit information, to approach the channel capacity.

An encoding strategy of the polar code precisely applies a characteristic of this phenomenon. A noise-free channel is used to transmit useful information of a user, and an all-noise channel is used to transmit agreed information or does not transmit information. The polar code is also a linear block code, an encoding matrix (also referred to as a generator matrix) of the Polar code is $G_N$, and an encoding process is $c_1^N = u_1^N G_N$. $c_1^N$ is a mother code of polar code, a length (that is, a code length) is N, and is a binary row vector. An element of $c_1^N$ is a mother code word, $u_1^N = (u_1, u_2, \ldots, u_N)$ is a binary row vector, a length (that is, a code length) is N, and $N=2^n$, and n is a positive integer. $G_N$ is an N×N matrix, and $G_N = B_N F_2^{\otimes(\log_2(N))}$, and $B_N$ is an N×N transposed matrix, for example, a bit reversal matrix. The so-called bit reversal permutation $y_1^N$ is obtained after a sequence $x_1^N$ with a length being N is arranged, where $y_a = x_b$, the binary representations of the sequence numbers a and b are unfolded in reverse order. For example, the sequence (1,2,3,4,5,6,7,8) is (1,5,3,7,2,6,4,8) after the sequence is arranged in bit reverse order; $F_2^{\otimes(log_2(N))}$ is defined as a Kronecker product of $log_2 N$ matrices $F_2$, and is defined as $F^{\otimes(log_2(N))}=F\otimes F^{\otimes(log_2(N)-1)}$, where $$F_2 = \begin{bmatrix} 1 & 0 \\ 1 & 1 \end{bmatrix},$$

and all addition and multiplication operations involved in the foregoing are addition and multiplication operations on a binary Galois field.

During encoding of the polar code, some bits in $u_1^N$ are used to carry information, which are referred to as information bits, and a set of indexes of these bits is denoted as A. Some other bits are placed with pre-agreed fixed values by the receive end and transmit end, which are referred to as fixed bits or frozen bits, and a set of indexes of the bits is represented by a complementary set $A^c$ of A. It should be noted that, these fixed bits may be set to 0, and the setting is also used in the description of the present application. In some possible implementations, a fixed bit sequence may be further set to a pre-agreed value by the receive end and the transmit end.

When the fixed bits are set to 0, the encoded output of the polar code may be simplified as follows: $x_1^N=u_A G_N(A)$, $u_A$ is an information bit set in $u_1^N$, $u_A$ is a row vector whose length is K bits, and K is a quantity of information bits in to-be-encoded bits, that is, $|A|=K$, where $|\cdot|$ represents a quantity of elements in the set, K is a size of an information block, $G_N(A)$ is a sub-matrix in a matrix $G_N$ obtained by rows corresponding to indexes in set A, and $G_N(A)$ is a K×N matrix. Selection of the set A (that is, selection of the information bits) determines performance of the polar code.

Figure 5:
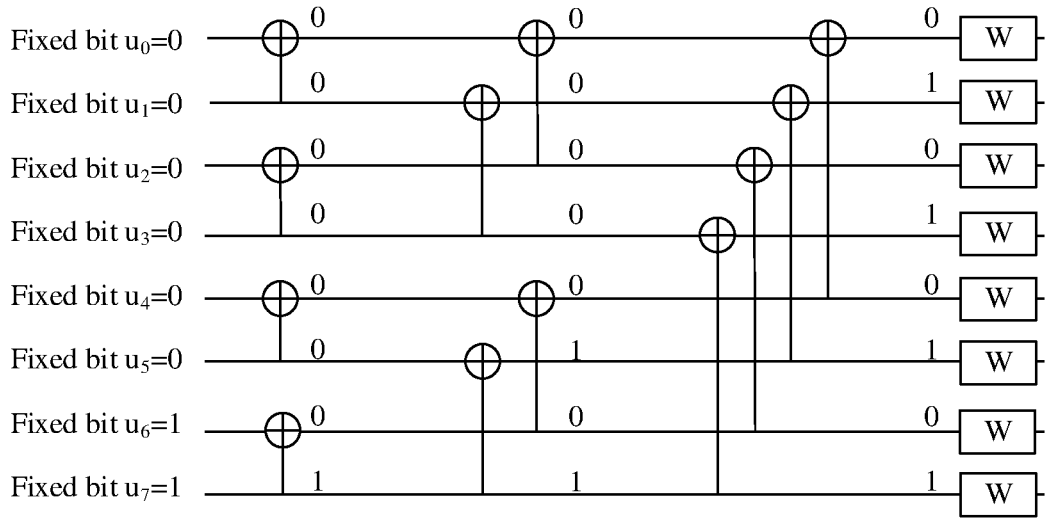
FIG. 5 is a schematic diagram of polar code encoding.

As an example rather than a limitation, FIG. 5 is a schematic encoding diagram of a polar code whose code length is 8. A symbol "$\oplus$" represents binary addition, and an input thereof is at a left side, and an output thereof is at a right side. Each solid line in FIG. 5 represents 1 bit. The to-be-encoded bits are sorted based on their respective reliability, bits with higher reliability are set as information bits, bits with lower reliability are set as fixed bits, and the fixed bits are set as pre-agreed fixed values, which is known by both the transmit end and the receive end in actual transmission. As an example rather than a limitation, values of the fixed bits are set to 0. As shown in FIG. 5, $u_7$, $u_6$, $u_5$, and $u_3$ are first four bits of reliability, and are set as the information bits, $u_4$, $u_2$, $u_1$, $u_0$ are four last bits of reliability, and are set as the fixed bits. Polar encoding is performed on four information bits $\{u_7, u_6, u_5, u_3\}$ in total to obtain eight encoded bits. After encoding, the eight encoded bits are modulated and sent through a noise channel.

A most commonly used decoding method for the polar code is successive cancellation (SC) decoding. The SC decoding has the following advantages: When a code length is large enough, it is theoretically proved that the polar code can reach a channel capacity under the SC decoding. The decoding has lower complexity, where the complexity has a linear relationship with a product of a code length N and a logarithm $log_2 N$ of the code length, and the complexity is $O(N \log_2 N)$. However, when the code length is short, the performance of traditional SC decoding is not ideal. Therefore, an enhanced SC decoding algorithm represented by a successive cancellation list (SCL) decoding algorithm is successively proposed, and further includes a successive cancellation stack (SCS) decoding, a successive cancellation hybrid (SCH) decoding, and the like. When the information sequence includes cyclic redundancy check (CRC) information, CRC-aided enhanced SC decoding is used, for example, CRC-aided SCL (CRC-aided successive cancellation list, CASCL) decoding, CRC-aided SCS (CRC-aided successive cancellation stack, CASCS) decoding, and CRC-aided SCH (CRC-aided successive cancellation hybrid, CASCH) decoding.

The following describes a process of encoding and decoding of Reed-Muller (RM) code in the present application.

RM code is a kind of linear block code and the RM code was first proposed by David Muller in 1954. At that time, Muller did not provide a feasible decoding algorithm. In the same year, Irving Reed proposed a large number logic decoding algorithm to complete a fast decoding of the RM code. Between 1969 and 1977, the RM code was widely used in Mars exploration. Even today, the RM code has great research value, and a fast decoding algorithm of the RM code is very suitable for a wireless communication system.

If related parameters r and m of the RM code are given, where r≤m, both r and m are non-negative integers, an r-order RM code may be expressed as: (r, m), a codeword length N of the RM code is $2^m$, a quantity of bits K of the information bits of the RM code is $$\sum_{i=0}^{r} C_m^i,$$

and a minimum code distance d of the RM code is $2^{m-r}$. Therefore, the RM code may also be expressed as: (N, K, d).

It should be understood that the RM code may be constructed by using a same N×N generator matrix as the polar code, that is, the polar code and the RM code may have a same encoding structure.

To solve a problem that performance of the code spectrum is poor when the code length is relatively short, Arikan proposed a polarization-adjusted convolutional code encoding scheme in 2019 based on the polar code, which is referred to as a polarization-adjusted convolutional code (PAC) code. In the PAC scheme, before polarization transformation is performed on unencoded bits, a convolution transformation is performed on the unencoded bits in advance, that is, a convolution matrix is multiplied. The simulation result shows that by using a proper convolution transformation and a powerful decoding algorithm, the scheme can reduce the quantity of codewords at the minimum code distance when a code length is N=128, and a code rate is R=1/2, and approximate a theoretical boundary of a finite length in an additive white gaussian noise (AWGN) channel. Although the PAC significantly reduces a quantity of codewords at a minimum code distance, and can improve the performance of the code spectrum in a case in which a code length is relatively short, and approaches a theoretical boundary of a finite length, the PAC is performed decoding by using a Fano decoding algorithm. This decoder has relatively large maximum complexity and is not friendly to hardware implementation.

It should be understood that the minimum code distance is an important parameter of a code, and is a basis for measuring an error detection and error correction capability of a code. A smaller quantity of codewords at the minimum code distance indicates a stronger error detection and error correction capability of a corresponding code, and better performance of a code.

Therefore, the present application provides a recursive interleaving encoding method with relatively low complexity and a corresponding decoding method, to improve the performance of the code spectrum and reduce decoding complexity when the code length is relatively short.

In the encoding method, information bits and frozen bits are selected based on row weights and/or reliability of generator matrices corresponding to to-be-encoded bits, to determine a to-be-encoded sequence. An interleaver is inserted into some stages in an encoding process (for example, an encoding process of an RM code or a polar code) of the to-be-encoded sequence, so that codewords in this phase enter encoding in a next stage after being interleaved. The encoding method in the present application can significantly reduce a quantity of codewords at a minimum code distance, optimize a code spectrum, and improve code performance while ensuring that the minimum code distance does not reduce. Compared with a PAC, the decoding algorithm in the present application is less complex and easier to implement. The recursive interleaving encoding method and the decoding method provided in the present application can achieve lower encoding and decoding complexity under frame error rate (FER) performance equivalent to that of the PAC. Compared with a conventional polar code encoding method or an RM code encoding method, a quantity of minimum codewords can be greatly reduced, and better code spectrum performance can be obtained, and has a very good application prospect in a future communication system.

Figure 6:
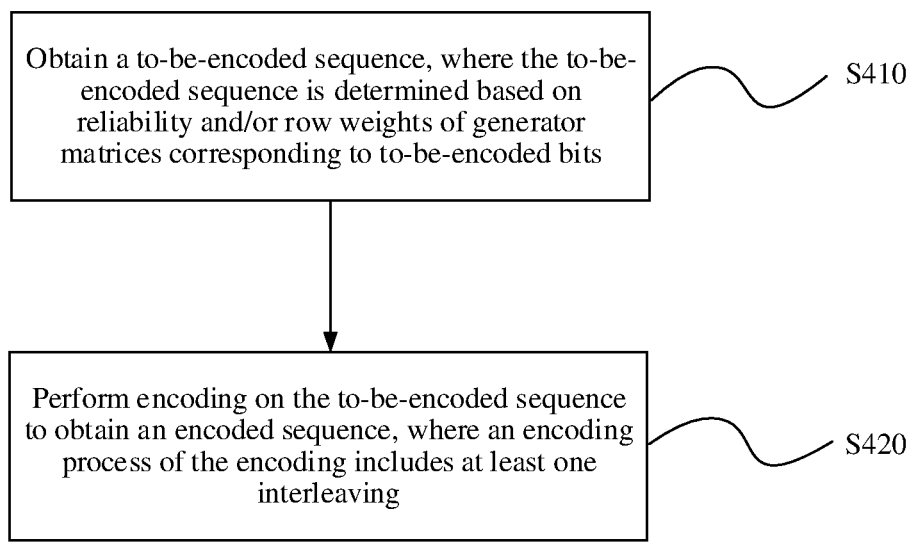
FIG. 6 is a schematic flowchart of an encoding method according to an embodiment of the present application.

The following describes in detail a specific processing process of the encoder 204 for recursive interleaving encoding according to the present application with reference to FIG. 6. For ease of description, an encoding method provided in the present application is denoted as an RI-RM-m (Recursive-Reed Muller-m) code in the following, where m represents a quantity of times of interleaving in the encoding method. For example, codewords in five stages in a process of encoding the to-be-encoded sequence are interleaved, and the quantity of times of interleaving in the encoding method is 5. It should be noted that, the five stages may be continuous or discontinuous, and there may be one or a plurality of interleavers that perform interleaving in each stage. A quantity of times of interleaving, a specific quantity of interleavers corresponding to each interleaving, and a stage in which an insertion is performed in an encoding process are not limited in the present application.

Figure 7:
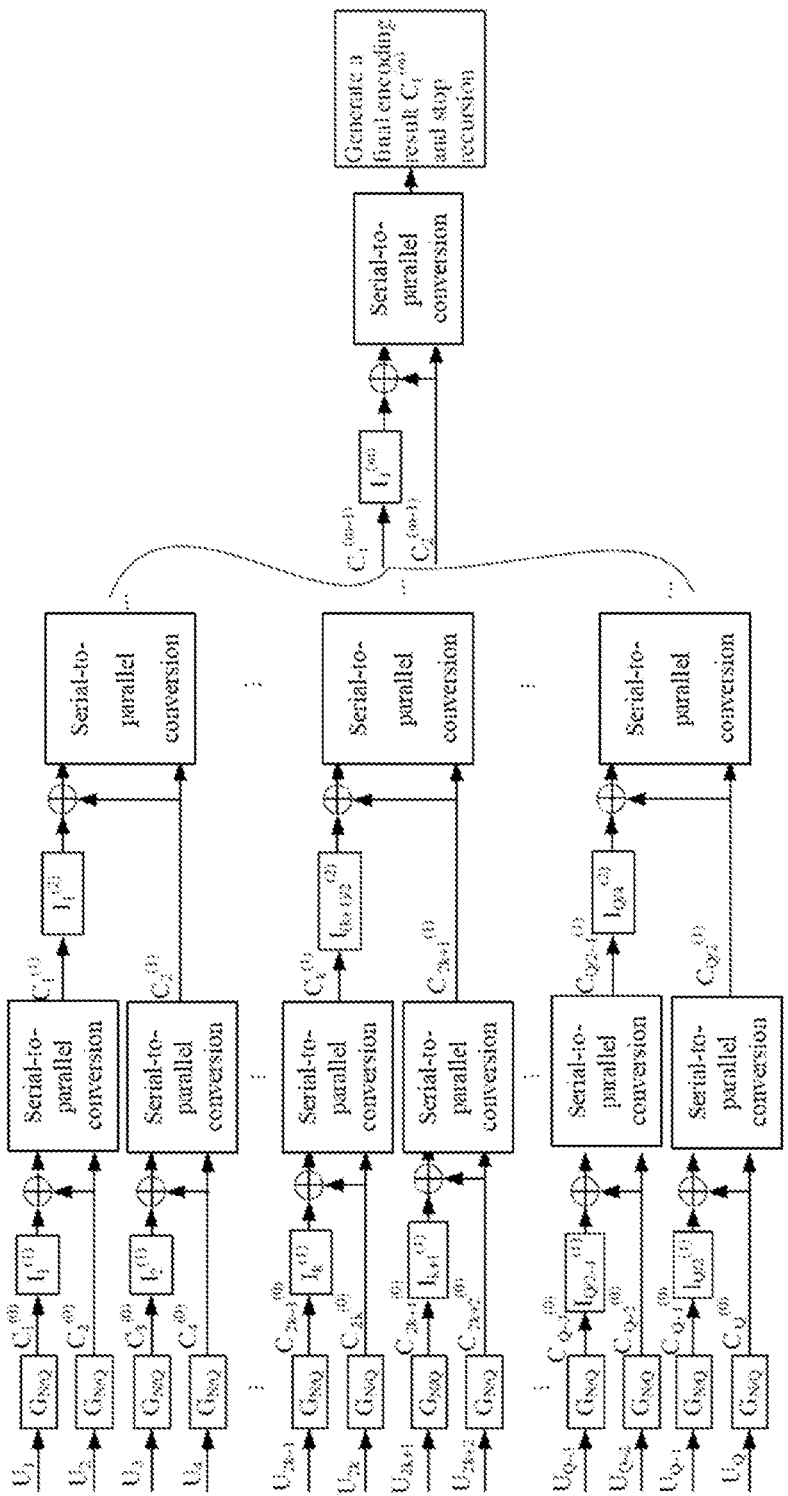
FIG. 7 is an example of an encoding method according to an embodiment of the present application.

It should be noted that, In the encoding method of the present application, the interleaver is inserted into at least one stage in the encoding process, and is inserted before an intermediate encoded sequence whose sorting sequence number corresponding to the stage is an odd number (a sequence number corresponding to the sorting starts from 1). The interleaver may be inserted before some intermediate encoded sequences whose sorting sequence numbers are odd numbers corresponding to the stage, or the interleaver may be inserted before all intermediate encoded sequences whose sorting sequence numbers are odd numbers corresponding to the stage. It should be understood that the sorting of the intermediate encoded sequences is determined based on equivalent grouping (as shown in FIG. 7), and this is not limited in the present application. It should be noted that, in the foregoing implementation, if sequence numbers of the first encoded sequence and the third encoded sequence are sorted starting from 0, it is equivalent to perform interleaving on encoded sequences whose sequence numbers are even numbers in the first encoded sequence and the third encoded sequence.

It should be understood that a naming manner of the RI-RM-m code is merely used to distinguish between different encoding manners. For ease of description, an encoding method of recursive interleaving in the present application is mainly described by using an encoding structure of a polar code or an RM code as an example. Actually, the encoding method is further applicable to another encoding manner of concatenated outer codes. For example, the outer codes may be BCH (Bose-Chaudhuri-Hocquenghem codes) encoding, low density parity check (LDPC) codes. The naming manner is merely used as an example, and should not be construed as any limitation on the present application herein.

FIG. 6 is a schematic flowchart of an RI-RM-m encoding method 400 according to an embodiment of the present application. The method 400 shown in FIG. 4 may be performed by an encoder in a sending device, for example, a wireless communication device. The method 400 includes:

S410. Obtain a to-be-encoded sequence, where the to-be-encoded sequence is determined based on reliability and/or row weights of generator matrices corresponding to to-be-encoded bits.

In a possible implementation, the to-be-encoded sequence includes information bits and fixed bits, where the information bits and the fixed bits are determined based on the reliability and/or the row weights of the generator matrices of the to-be-encoded bits. In other words, the information bits and the fixed bits in the to-be-encoded bits are first determined based on the reliability and/or the row weights of the generator matrices of the to-be-encoded bits, and then the information bits are used to carry target information, and the fixed bits are used to carry preset information. In this way, the to-be-encoded sequence is obtained, and the to-be-encoded sequence is in a one-to-one correspondence with the to-be-encoded bits.

It should be understood that the selected information bits are used to carry the target information, and the selected fixed bits are set to pre-agreed fixed values by the receive end and the transmit end. It should be noted that, these fixed bits may be set to 0, and the setting is also used in the description of the present application. In some possible implementations, a fixed bit sequence may be further set to a pre-agreed value by the receive end and the transmit end.

In a possible implementation, the encoding method in this embodiment includes but is not limited to the following three manners of selecting the information bits and the fixed bits (namely, frozen bits) from the to-be-encoded bits:

Manner A

Selection is performed based on row weights of generator matrices, that is, information bits and fixed bits are selected based on the row weights of corresponding generator matrices for the to-be-encoded bits. The row weights of the generator matrices corresponding to the information bits are greater than or equal to the row weights of the generator matrices corresponding to the fixed bits.

It should be noted that, the row weights of the generator matrices corresponding to the information bits may be equal to the row weights of the generator matrices corresponding to the fixed bits. Similarly, reliability corresponding to the information bits may be equal to reliability corresponding to the fixed bits. For example, if K information bits need to be selected from N to-be-encoded bits, after the to-be-encoded bits are sorted in descending order (a sequence number starts from 1) based on the row weights or the reliability of corresponding generator matrices, if the row weights or the reliability of the generator matrices corresponding to to-be-encoded bits whose sequence numbers are k−2 to to-be-encoded bits whose sequence number are K+2 are equal, except that to-be-encoded bits whose sequence numbers are 1 to to-be-encoded bits whose sequence numbers are K−1 are selected as the information bits, alternatively, any two bits may be selected from to-be-encoded bits whose sequence numbers are K−2 to K+2 as the information bits, and other N−K bits of the to-be-encoded bits are used as the fixed bits. In this case, the row weights or the reliability of the generator matrices corresponding to the two fixed bits are equal to those of the two information bits. Similarly, when the to-be-encoded bits are selected based on a preset row weight threshold of generator matrices or a preset reliability threshold, bits in which row weights of corresponding generator matrices are equal to the preset row weight threshold or bits in which corresponding reliability is equal to a reliability threshold may also be selected.

Assuming that K bits need to be selected as the information bits. In a possible implementation, a row weight of a generator matrix G corresponding to each to-be-encoded bit is first calculated. Then, the to-be-encoded bits are sorted in descending order or ascending order of row weights of corresponding generator matrices. Assuming that K bits need to be selected as the information bits. If the to-be-encoded bits are sorted in descending order of the row weights of the generator matrices, first K bits are selected as the information bits, and other bits are used as the fixed bits. Similarly, if the to-be-encoded bits are sorted in ascending order of the row weights of the generator matrices, last K bits are selected as the information bits, and other bits are used as the fixed bits.

Optionally, a quantity K of the information bits may be preset.

Manner B:

Selection is performed based on reliability, that is, information bits and fixed bits are selected based on reliability for the to-be-encoded bits. The reliability of the information bits is greater than or equal to the reliability of the fixed bits.

Assuming that K bits need to be selected as the information bits. In a possible implementation, reliability of a sub-channel corresponding to each to-be-encoded bit is first calculated. Then, the to-be-encoded bits are sorted in descending order of reliability or in ascending order of reliability. Assuming that K bits need to be selected as information bits. If the to-be-encoded bits are sorted in descending order of reliability, first K bits are selected as the information bits, and the other bits are used as fixed bits. Similarly, if the to-be-encoded bits are sorted in ascending order of reliability, last K bits are selected as the information bits, and the other bits are used as the fixed bits.

Optionally, a quantity K of the information bits may be preset.

It should be noted that, when determining the reliability of the sub-channel corresponding to each to-be-encoded bit, that is, which are reliable channels and which are unreliable channels, and a method for measuring reliability of each sub-channel includes but is not limited to the following method: a bhattacharyya parameter method, a density evolution (DE) method, and a gaussian approximation method.

Manner C

Selection is performed based on reliability and row weights of generator matrices, that is, the information bits and the fixed bits are selected based on the row weights and the reliability of corresponding generator matrices for to-be-encoded bits. The row weights of the generator matrices corresponding to the information bits are greater than or equal to row weights of the generator matrices corresponding to the fixed bits, and the reliability corresponding to the information bits is greater than a preset reliability threshold. Alternatively, the reliability corresponding to the information bits is greater than or equal to the reliability corresponding to the fixed bits, and the row weights of the generator matrices corresponding to the information bits are greater than the preset row weight threshold.

Assuming that K bits need to be selected as information bits, a possible selection method is as follows:
  selecting to-be-encoded bits in which row weights of generator matrices are greater than a preset row weight threshold;
  determining reliability corresponding to to-be-encoded bits in which the row weights of the generator matrices are greater than the preset row weight threshold, and sorting, in descending order of reliability (or ascending order of reliability), the bits in which the row weights of the generator matrices are greater than the preset row weight threshold; and
  If sorting is performed in descending order of the reliability, first K bits are selected as the information bits, and other bits in the to-be-encoded bits are used as the fixed bits. Similarly, if sorting is performed in ascending order of the reliability, last K bits are selected as the information bits, and other bits in the to-be-encoded bits are used as the fixed bits.

In a possible implementation, to-be-encoded bits in which row weights of generator matrices are greater than a preset row weight threshold may be selected by calculating a row weight of a generator matrix G corresponding to each to-be-encoded bit, sorting the to-be-encoded bits in descending order of the row weights (or in ascending order of the row weights) of the generator matrices, selecting M to-be-encoded bits based on the preset row weight threshold or a sequence number of the row weight corresponding to each to-be-encoded bit, and selecting K information bits from the M to-be-encoded bits based on a sequence number of reliability corresponding to each to-be-encoded bit, and M≥K. Both M and K are positive integers.

Assuming that K bits need to be selected as information bits, another possible selection method is as follows:

To-be-encoded bits in which reliability is greater than a preset reliability threshold are selected.

A row weight of a generator matrix G corresponding to a to-be-encoded bit whose reliability is greater than a preset reliability threshold is determined, and the bits whose reliability is greater than the preset reliability threshold in descending order (or ascending order) of row weights of generator matrices are sorted.

If sorting is performed in descending order of the row weights of the generator matrices, first K bits are selected as the information bits, and other bits in the to-be-encoded bits are used as the fixed bits. Similarly, if sorting is performed in ascending order of the row weights of the generator matrices, last K bits are selected as the information bits, and other bits in the to-be-encoded bits are used as the fixed bits.

In a possible implementation, to-be-encoded bits whose reliability is greater than a preset reliability threshold may be selected by calculating reliability corresponding to each to-be-encoded bit, sorting the to-be-encoded bits in descending order of the reliability (or in ascending order of the reliability), selecting M to-be-encoded bits based on a preset reliability threshold or a sequence number of the reliability corresponding to each to-be-encoded bit, and then selecting K information bits from the M to-be-encoded bits based on a sequence number of a row weight of a generator matrix corresponding to each to-be-encoded bit. M is greater than or equal to K, and both M and K are positive integers.

Optionally, a quantity K of the information bits may be preset.

It should be noted that, when determining reliability of a sub-channel corresponding to each to-be-encoded bit, that is, which are reliable channels and which are unreliable channels, and a method for measuring reliability of each sub-channel includes but is not limited to: a bhattacharyya parameter method, a density evolution (DE) method, and a gaussian approximation method.

It should further be noted that, when the information bits are selected, specific values of the row weights corresponding to the to-be-encoded bits and/or a specific value of the reliability corresponding to the to-be-encoded bits are compared. Correspondingly, the preset row weight threshold and the preset reliability threshold are also specific values. For example, a specific value corresponding to the reliability or the preset reliability threshold may be an error probability value of the sub-channel corresponding to the bit that is calculated according to a Gaussian approximation method. However, when information bit selection is performed on to-be-encoded bits sorted according to a specific rule, first K bits or last K bits are selected as the information bits based on the sequence number.

S420. Perform encoding on the to-be-encoded sequence to obtain an encoded sequence, where an encoding process of the encoding includes at least one interleaving.

The following uses an example in which an encoding process of the to-be-encoded sequence includes m times of interleaving and an RM encoding process, and further describes an RI-RM-m encoding process of the to-be-encoded sequence in step 420 with reference to FIG. 7. m is a positive integer.

FIG. 7 is an example of an encoding method in the present application. In this example, the encoding method in the present application includes m times of interleaving, that is, m stages of an encoding process in the present application are interleaved. Interleavers are inserted before an odd-numbered encoded sequence in a plurality of encoded sequences obtained in each of the m stages. It should be understood that a quantity of times of interleaving, a quantity of interleavers used for each interleaving, and a position inserted by the interleaver in FIG. 7 are merely used as examples. Actually, the present application is not limited thereto.

The following RI-RM-m encoding process may be denoted as $C_1^{(m)} = U \times G_N$, where $G_N$ is an N×N generator matrix, U is a to-be-encoded sequence, and $C_1^{(M)}$ is an encoded sequence.

S421: Perform first encoding on the to-be-encoded sequence to obtain Q first encoded sequences denoted as $\{C_1^{(0)}, C_2^{(0)}, \ldots, C_k^{(0)}, \ldots, C_Q^{(0)}\}$, where Q and k are positive integers.

In a possible implementation, the first encoding includes: performing equivalent grouping on the to-be-encoded sequences, equivalently treating the to-be-encoded sequences as Q groups of to-be-encoded sub-sequences, and performing an encoding process before the first interleaving on the Q groups of to-be-encoded sub-sequences, to obtain Q first encoded sequences. In a possible implementation, the encoding process before the first interleaving may further include one or more times of interleaving.

For example, an encoding method of RM encoding is used as an example. When first interleaving is the first interleaving (as $I_k^{(1)}$ shown in FIG. 7), if an interleaver corresponding to the first interleaving is inserted into after a first stage and before a second stage in an RM code process, first encoding is performed. That is, the foregoing encoding process before the first interleaving (an encoding process before $I_k^{(1)}$ in FIG. 7) refers to encoding of the first stage in the RM code encoding process. When first interleaving is a non-first interleaving (as $I_k^{(2)}$ shown in FIG. 7), if the interleaver is inserted in the first interleaving after the second stage before the third stage in the RM code process, the first encoding, that is, the encoding process before the first interleaving (encoding process before $I_k^{(2)}$ as shown in FIG. 7) refers to encoding in the second stage and a previous stage in a process of performing RM code encoding on the Q groups of the to-be-encoded sub-sequences, and an interleaving operation is included in the encoding process in the second stage and the previous stage. (as shown in FIG. 7, the first encoding further includes an interleaving operation corresponding to $I_k^{(1)}$).

In a possible implementation, the equivalent grouping of the to-be-encoded sequence is determined based on a preset quantity m of times of interleaving.

It should be noted that, description of performing "equivalent grouping" on the to-be-encoded sequence in the foregoing first encoding is merely for ease of description and understanding. Actually, a grouping operation is not necessarily performed on the to-be-encoded sequence. The present application should not be limited herein. Similarly, an encoding process (for example, a polar code encoding process or an RM code encoding process) before the first interleaving may be first performed on the to-be-encoded sequence, and then intermediate encoding results obtained after the encoding process are performed equivalent grouping to obtain Q first encoded sequences.

It should be further noted that, if an encoding process before first interleaving does not involve an interleaving operation, the encoding manner is similar to the encoding manner in a conventional technology, and details are not described herein again.

It should be further noted that, if the Q to-be-encoded sub-sequences are obtained by performing equivalent grouping on the to-be-encoded sequence, quantities of information bits and fixed bits in each to-be-encoded sub-sequence may be determined. For example, if a quantity of the information bits in the $i^{th}$ group of a to-be-encoded sub-sequence $Q_i$ is denoted as $K_i$, the fixed bits corresponding to the group are other bits excluding the information bits $K_i$ in the to-be-encoded sub-sequence $Q_i$, where i is a positive integer, and $1 \le i \le Q$.

It should be noted that, for ease of description, the code length N of the to-be-encoded sequence and the quantity K of information bits in the to-be-encoded sequence are denoted as (N, K) in the following.

As an example rather than a limitation, as shown in FIG. 7, a code length of a to-be-encoded sequence U is N, and U is a binary row vector. The to-be-encoded sequence is denoted as $\{u_1, u_2, \ldots, u_N\}$, and Q to-be-encoded sub-sequences obtained after equivalent grouping is performed on the to-be-encoded sequence are respectively denoted as $\{U_1, U_2, \ldots, U_Q\}$. A code length of each to-be-encoded sub-sequence $U_i$ is N/Q (N is an integer multiple of Q), which may be indicated as $U_i = \{u_{(i-1)N/Q+1}, u_{(i-1)N/Q+2}, \ldots, u_{iN/Q}\}$, $1 \le i \le Q$, and i is a positive integer. Then, an encoding process before first interleaving is performed on the Q to-be-encoded sub-sequences to obtain Q first encoded sequences $\{C_1^{(0)}, C_2^{(0)}, \ldots, C_k^{(0)}, \ldots, C_Q^{(0)}\}$.

In a possible implementation, as shown in FIG. 7, a correspondence between a quantity Q of equivalent groups and a quantity m of times of interleaving is $Q = 2^m$.

S422: Perform first interleaving on at least one of the Q first encoded sequences to obtain Q second encoded sequences.

In a possible implementation, as shown in FIG. 7, first interleaving is performed on Q/2 odd-numbered first encoded sequences in the Q first encoded sequences, that is, first interleaving is performed on $\{C_1^{(0)}, C_3^{(0)}, \ldots, C_{2k-1}^{(0)}, \ldots, C_{Q-1}^{(0)}\}$ in the first encoded sequences, to obtain Q second encoded sequences denoted as $\{I_1^{(1)}(C_1^{(0)}), C_2, \ldots, I_k^{(1)}(C_{2k-1}^{(0)}), C_{2k}, \ldots, I_{Q/2}^{(1)}(C_{Q-1}^{(0)}), C_Q\}$, where $I_k^{(1)}$ corresponds to the $k^{th}$ interleaver in the first interleaving.

S423: Perform third encoding on the Q second encoded sequences to obtain P third encoded sequences denoted as $\{C_1^{(1)}, C_2^{(1)}, \ldots, C_k^{(1)}, \ldots, C_P^{(1)}\}$ where k and P are positive integers.

In a possible implementation, the third encoding includes performing next-stage polar encoding or RM encoding on the Q interleaved second encoded sequences. As an example rather than a limitation, an encoding method of RM encoding is used as an example. If an interleaver is added after a second stage and before a third stage in an RM encoding process, the second encoding refers to performing the RM encoding in the third stage on Q second encoded sequences obtained after an interleaving operation performed by the interleaver.

Similarly, a first interleaver $I_1^{(1)}$ inserted in first interleaving in FIG. 7 is used as an example (a superscript of I represents a quantity of times of interleaving, and a subscript represents a sequence number of interleavers in the current interleaving (the sequence starts from 1)). The third encoding process includes performing an exclusive OR processing on $I_1^{(1)}(C_1^{(0)})$ and $C_2$ to obtain $$\begin{bmatrix} I_1^{(1)}(C_1^{(0)}) \oplus C_2 \\ C_2 \end{bmatrix},$$

and then performing serial-to-parallel conversion to obtain $[I_1^{(1)}(C_1^{(0)}) \oplus C_2, C_2]$.

In a possible implementation, as shown in FIG. 7, third encoding is performed on the Q second encoded sequences to obtain Q/2 (that is, P) third encoded sequences denoted as $\{C_1^{(1)}, C_2^{(1)}, \ldots, C_k^{(1)}, \ldots, C_{Q/2}^{(1)}\}$, where k, P, and Q are all positive integers, and $C_k^{(1)} = [I_k^{(1)}(C_{2k-1}^{(0)}) + C_{2k}^{(0)}, C_{2k}^{(0)}]$.

S424: Perform second interleaving on at least one of the P third encoded sequences.

In a possible implementation, as shown in FIG. 7, second interleaving is performed on Q/4 (that is, P/2) third encoded sequences $\{C_1^{(1)}, C_3^{(1)}, \ldots, C_{2k-1}^{(1)}, \ldots, C_{Q/2-1}^{(1)}\}$ whose sequence numbers are odd numbers in the Q/2 (that is, P) third encoded sequences.

Similar to the foregoing process, third interleaving, fourth encoding, fourth interleaving, and fifth encoding continue to be performed, until an encoded sequence $C_1^{(m)}$ finally obtained after m times of interleaving is performed, where $C_1^{(m)} = [I_1^{(m)}(C_1^{(m-1)}) \oplus C_2^{(m-1)}, C_2^{(m-1)}]$.

It should be noted that, all encoding processes after the first interleaving may be referred to as second encoding, and may be understood as performing second encoding on Q second encoded sequences obtained after the first interleaving, to obtain a final encoded sequence. Both the third encoding and the encoding process before the second interleaving is performed to obtain the final encoded sequence belong to the second encoding.

It should further be noted that, the interleaver may be any interleaver, for example, a random interleaver, any optimized interleaver, or a cyclic shift interleaver. This is not limited in the present application.

It should further be noted that, for any interleaver, a theoretical or numerical simulation result may be used to prove that when the encoding method in the present application is used, compared with an original encoding scheme that is corresponding to the encoding method in the present application and that is not added to the interleaver, a minimum code distance of a newly generated codeword does not become smaller.

It should further be noted that, in addition, the scheme described in the foregoing embodiment is corresponding to conventional RM code encoding or polar code encoding. Actually, when a code weight of a codeword meets a specific condition, for example, when two codewords $C_1$ and $C_2$ meet $W(C_1) \geq d_{min}$, $W(C_2) \geq d_{min}/2$, (W(g) represents the code weight of the codeword), alternatively, when four codewords $C_1$, $C_2$, $C_3$, and $C_4$ meet $W(C_1) \geq d_{min}$, $W(C_2) \geq d_{min}/2$, $W(C_3) \geq d_{min}/2$, and $W(C_4) \geq d_{min}/4$, the encoding method in the present application may be used for a codeword generated in another encoding manner, for example, another encoding manner of concatenated outer codes. The outer code may be a BCH code, and an LDPC code.

Optionally, rate matching may further be performed on the result of encoding, that is, different processing is performed on different bit stream lengths, so that the bit stream length matches an actual transmission capability. In a possible implementation, when the information bits and the fixed bits of the to-be-encoded bits are determined, a rate matching process further needs to be considered. A rate matching manner is not limited in the present application.

Figure 8:
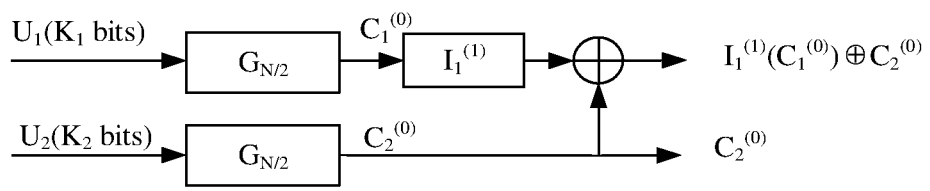
FIG. 8 is another example of an encoding method according to an embodiment of the present application.

With reference to FIG. 8, the following uses an example in which a quantity times of interleaving is 1 (the interleaving includes one interleaver) and an RM encoding process as an example to describe an RI-RM-1 encoding processing process in S420.

The following RI-RM-1 encoding process may be denoted as:
$C_1^{(1)} = U \times G_N$
that is, $$C_1^{(1)} = [U_1, U_2] \times \begin{bmatrix} G_{N/2} & 0 \\ G_{N/2} & G_{N/2} \end{bmatrix},$$

where $G_N$ is an N×N generator matrix, correspondingly, $G_{N/2}$ is an N/2×N/2 matrix, U is a to-be-encoded sequence, and $C_1^{(1)}$ is an encoded sequence corresponding to RI-RM-1.

Step 1: Perform first encoding on the to-be-encoded sequence to obtain two first encoded sequences denoted as $\{C_1^{(0)}, C_2^{(0)}\}$.

Assuming that a code length of the to-be-encoded sequence U is N, and the to-be-encoded sequence is denoted as $\{u_1, u_2, \ldots, u_N\}$.

The first encoding includes: two to-be-encoded sub-sequences obtained by performing equivalent grouping on the to-be-encoded sequence based on a preset quantity 1 of times of interleaving are respectively denoted as $\{U_1, U_2\}$.

$U_1 = \{u_1, u_2, u_3, \ldots, u_{N/2}\}$
$U_2 = \{u_{N/2+1}, u_{N/2+2}, u_{N/2+3}, \ldots, u_N\}$ Information bits in $U_1$ are $K_1$ bits, bits other than the information bit $K_1$ in $U_1$ are fixed bits, information bits in $U_2$ are $K_2$ bits, and bits other than the information bit $K_2$ in $U_2$ are fixed bits. The code lengths of the to-be-coded sub-sequences $U_1$ and $U_2$ are both N/2.

In a possible implementation, a quantity N of code lengths of to-be-encoded bits is 128, and a quantity of information bits is 64 bits. Information bits in $U_1$ are 22 bits, fixed bits in $U_1$ are 42 bits, information bits in $U_2$ are 42 bits, and fixed bits in $U_2$ are 22 bits. The code lengths of the to-be-encoded sub-sequences $U_1$ and $U_2$ are both 64 bits.

The first encoding further includes a process of RM encoding before interleaving is performed on the two to-be-encoded sub-sequences $\{U_1, U_2\}$, so as to obtain two first encoded sequences $\{C_1^{(0)}, C_2^{(0)}\}$.

Step 2: Perform a first interleaving operation on $\{C_1^{(0)}\}$ in the two first encoded sequences to obtain two second encoded sequences $\{I_1^{(1)}(C_1^{(0)}), C_2\}$.

Step 3: Perform third encoding on the two second encoded sequences $\{I_1^{(1)}(C_1^{(0)}), C_2\}$ on which a partial interleaving operation is performed, to obtain one third encoded sequence $\{C_1^{(1)}\}$. The third encoding includes performing exclusive OR processing on $I_1^{(1)}(C_1^{(0)})$ and $C_2$ to obtain $I_1^{(1)}(C_1^{(0)}) \oplus C_2^{(0)}$, and then performing serial-to-parallel conversion on $$\begin{bmatrix} I_1^{(1)}(C_1^{(0)}) \oplus C_2^{(0)}, \\ C_2^{(0)} \end{bmatrix}$$

to obtain one third encoded sequence $[I_1^{(1)}(C_1^{(0)}) \oplus C_2^{(0)}, C_2^{(0)}]$, that is, $C_1^{(1)} = [I_1^{(1)}(C_1^{(0)} \oplus C_2^{(0)}, C_2^{(0)}]$ It should be understood that the third encoded sequence $\{C_1^{(1)}\}$ is a sequence obtained after RI-RM-1 encoding is performed on the to-be-encoded sequence.

Figure 9:
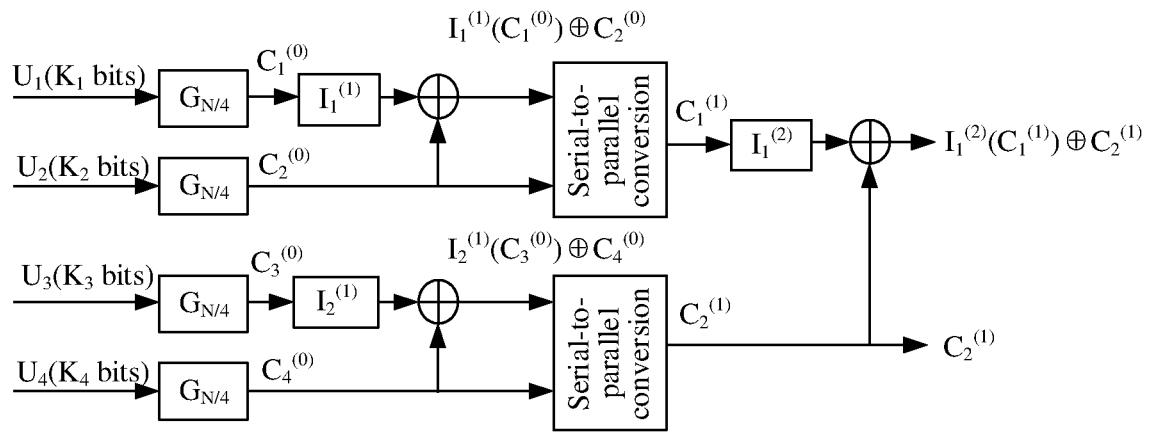
FIG. 9 is still another example of an encoding method according to an embodiment of the present application.

Similarly, with reference to FIG. 9, the following uses an example in which a quantity of times of interleaving is 2 (the first interleaving includes two interleavers, and the second interleaving includes one interleaver) and an RM code encoding process as an example to describe an RI-RM-2 encoding processing process in S420.

The following RI-RM-2 encoding process may be denoted as:

$C_1^{(2)} = U \times G_N$ that is, $C_1^{(2)} = [U_1, U_2, U_3, U_4] \times G_N$, where $G_N$ is an N×N generator matrix, U is a to-be-encoded sequence, and $C_1^{(2)}$ is an encoded sequence corresponding to the RI-RM-2.

Step 1: Perform first encoding on the to-be-encoded sequences to obtain four first encoded sequences denoted as $\{C_1^{(0)}, C_2^{(0)}, \ldots, C_k^{(0)}, \ldots, C_Q^{(0)}\}$.

Assuming that a code length of the to-be-encoded sequence U is N, and the to-be-encoded sequence is denoted as $\{u_1, u_2, \ldots, u_N\}$.

The first encoding includes: four to-be-encoded sub-sequences obtained by performing equivalent grouping on a to-be-encoded sequence U based on a preset quantity of 2 times of interleaving denoted as $\{U_1, U_2, U_3, U_4\}$, where $U_1 = \{u_1, u_2, u_3 \ldots, u_{N/4}\}$
$U_2 = \{u_{N/4+1}, u_{N/4+2}, u_{N/4+3} \ldots, u_{2N/4}\}$
$U_3 = \{u_{2N/4+1}, u_{2N/4+2}, u_{2N/4+3} \ldots, u_{3N/4}\}$
$U_4 = \{u_{3N/4+1}, u_{3N/4+2}, u_{3N/4+3} \ldots, u_N\}$ Information bits in $U_1$ are $K_1$ bits, bits other than the information bits $K_1$ in the $U_1$ are fixed bits, information bits in $U_2$ are $K_2$ bits, bits other than the information bits $K_2$ in the $U_2$ are fixed bits, information bits in $U_3$ are $K_3$ bits, bits other than the information bit $K_3$ in the $U_3$ are fixed bits, information bits in $U_4$ are K4 bits, and bits other than the information bits $K_4$ in the $U_4$ are fixed bits. Code lengths of the to-be-encoded sub-sequences $U_1$, $U_2$, $U_3$, and $U_4$ are all N/4.

In a possible implementation, a quantity N of code lengths of to-be-encoded bits is 128, and a quantity of information bits is 64 bits. Information bits in $U_1$ are 6 bits, fixed bits in $U_1$ are 26 bits, information bits in $U_2$ are 16 bits, fixed bits in $U_2$ are 16 bits, information bits in $U_3$ are 16 bits, fixed bits in $U_3$ are 16 bits, information bits in $U_4$ are 26 bits, and fixed bits in $U_4$ are 6 bits. The code lengths of the to-be-coded sub-sequences $U_1$, $U_2$, $U_3$, and $U_4$ are all 32 bits.

The first encoding further includes a process of RM encoding before first interleaving is performed on the four to-be-encoded sub-sequences $\{U_1, U_2, U_3, U_4\}$, so as to obtain four first encoded sequences $\{C_1^{(0)}, C_2^{(0)}, C_3^{(0)}, C_4^{(0)}\}$.

Step 2: Perform a first interleaving operation on $\{C_1^{(0)}, C_3^{(0)}\}$ in the four first encoded sequences. The first interleaving includes two interleavers, and the obtained four second encoded sequences denoted as:

$\{I_1^{(1)}(C_1^{(0)}), C_2^{(0)}, I_2^{(1)}(C_3^{(0)}), C_4^{(0)}\}$.

Step 3: Perform third encoding on the four second encoded sequences on which a partial interleaving operation is performed to obtain two third encoded sequences $\{C_1^{(1)}, C_2^{(1)}\}$. The third encoding includes performing exclusive OR processing on $I_1^{(1)}(C_1^{(0)})$ and $C_2^{(0)}$ to obtain $I_1^{(1)}(C_1^{(0)}) \oplus C_2^{(0)}$, and then performing serial-to-parallel conversion on $$\begin{bmatrix} I_1^{(1)}(C_3^{(0)}) \oplus C_4^{(0)}, \\ C_4^{(0)} \end{bmatrix}$$

to obtain a first third encoded sequence $[I_1^{(1)}(C_1^{(0)}) \oplus C_2^{(0)}, C_2^{(0)}]$. Similarly, the third encoding further includes performing exclusive OR processing on $I_2^{(1)}(C_3^{(0)})$ and $C_4^{(0)}$ to obtain $I_2^{(1)}(C_3^{(0)}) \oplus C_4^{(0)}$, and then performing serial-to-parallel conversion on $$\begin{bmatrix} I_2^{(1)}(C_3^{(0)}) \oplus C_4^{(0)}, \\ C_4^{(0)} \end{bmatrix}$$

to obtain two third encoded sequence $[I_2^{(1)}(C_3^{(0)}) \oplus C_4^{(0)}, C_4^{(0)}]$, that is, $C_1^{(1)} = [I_1^{(1)}(C_1^{(0)}) \oplus C_2^{(0)}, C_2^{(0)}]$
$C_2^{(1)} = [I_2^{(1)}(C_3^{(0)}) \oplus C_4^{(0)}, C_4^{(0)}]$ Step 4: Perform a second interleaving operation on $\{C_1^{(1)}\}$ in the two third encoded sequences $\{C_1^{(1)}, C_2^{(1)}\}$ obtained by performing the first interleaving and the third encoding. The second interleaving includes an interleaver, and a fourth encoded sequence $\{I_1^{(2)}(C_1^{(1)}), C_2^{(1)}\}$ is obtained.

Step 5: Perform fourth encoding on the two fourth encoded sequences $\{I_1^{(2)}(C_1^{(1)}), C_2^{(1)}\}$ on which the partial interleaving operation is performed to obtain one fifth encoded sequence $\{C_1^{(2)}\}$. The fourth encoding includes performing exclusive OR processing on $I_1^{(2)}(C_1^{(1)})$ and $C_2^{(1)}$ to obtain $I_1^{(2)}(C_1^{(1)}) \oplus C_2^{(1)}$, and then performing serial-to-parallel conversion on $$\begin{bmatrix} I_1^{(2)}(C_1^{(1)}) \oplus C_2^{(1)} \\ C_2^{(1)} \end{bmatrix}$$

to obtain one fifth encoded sequence $[I_1^{(2)}(C_1^{(1)}) \oplus C_2^{(1)}, C_2^{(1)}]$, that is, $C_1^{(2)} = [I_1^{(2)}(C_1^{(1)} \oplus C_2^{(1)}, C_2^{(1)}]$ It can be learned from step 3 that:

$C_1^{(1)} = [I_1^{(1)}(C_1^{(0)} \oplus C_2^{(0)}, C_2^{(0)}]$
$C_2^{(1)} = [I_2^{(1)}(C_3^{(0)} \oplus C_4^{(0)}, C_4^{(0)}]$ therefore, the final encoding result $C_1^{(2)}$ may also be expressed as:

$C_1^{(2)} = [I_1^{(2)}(I_1^{(1)}(C_1^{(0)} \oplus C_2^{(0)}) \oplus I_2^{(1)}(C_3^{(0)}) \oplus (C_4^{(0)})), I_1^{(2)}(C_2^{(0)}) \oplus C_4^{(0)}, I_1^{(2)}(C_3^{(0)}) \oplus C_4^{(0)}, C_4^{(0)}]$ It should be understood that the fifth encoded sequence $\{C_1^{(2)}\}$ is a sequence obtained after RI-RM-2 encoding is performed on the to-be-encoded sequence.

The following describes a decoding method corresponding to the recursive interleaving encoding method provided in the present application.

The decoding method in the present application includes the following steps: receiving a to-be-decoded sequence; and performing decoding on the to-be-decoded sequence to obtain a decoded sequence, where a decoding process of the decoding includes at least one de-interleaving.

It should be noted that, due to influence of factors such as channel noise, the encoded sequence may not be the same as the to-be-decoded sequence obtained after channel transmission.

In a possible implementation, that the decoding process of the decoding includes at least one de-interleaving includes: performing first decoding on a to-be-decoded sequence to obtain a first sub-sequence; performing first de-interleaving on the first sub-sequence to obtain a second sub-sequence; and performing second decoding on the second sub-sequence to obtain the decoded sequence. In a possible implementation, an decoding process before the first de-interleaving may further include one or more times of de-interleaving.

In a possible implementation, the second decoding includes: performing third decoding on the second sub-sequence to obtain a third sub-sequence; performing second de-interleaving on the third sub-sequence to obtain a fourth sub-sequence; and performing fourth decoding on the fourth sub-sequence to obtain the decoded sequence.

A decoding method used by the receive end (or referred to as a decoder side) to receive the to-be-decoded bit sequence from the transmit end corresponds to the encoding method in the present application. In other words, the decoder side knows an encoding structure of an encoder side in advance. Corresponding to the interleaver inserted in the encoding method in the present application, a de-interleaving operation is correspondingly performed in a decoding process. Another decoding method that does not involve an interleaver is similar to a decoding method in a conventional technology, and reference may be made to a decoding algorithm in a conventional technology. For example, reference may be made to an SC decoding algorithm, an SCL decoding algorithm, an SCS decoding algorithm, and an SCH decoding algorithm. Alternatively, CRC information may be added to an information sequence, and an enhanced SC decoding algorithm assisted by a CRC is used, for example, a CASCL decoding algorithm, a CASCS decoding algorithm, and a CASCH decoding algorithm.

It should be understood that de-interleaving in the foregoing decoding process is in a one-to-one correspondence with interleaving in the encoding process. In other words, de-interleaving is performed only correspondingly on a position at which an interleaver appears in the encoding process. For another decoding process that does not involve a position of the interleaver, refer to a corresponding decoding process in a conventional technology.

It should be noted that, if the decoding mode used in the present application includes some operations of performing reverse encoding on a decoded current decoding result, the decoding process in the present application may further include an interleaving operation. Specifically, the first decoding and the second decoding may further include an interleaving operation. For example, in a process of solving a current sub-sequence in a current decoding stage, reverse encoding needs to be performed on a decoding result of a previous sub-sequence in a same stage, and an interleaver is inserted before a position corresponding to the previous sub-sequence in the encoding process. In this case, the performing a reverse encoding operation on the current decoding result of the previous sub-sequence that has been decoded further includes an interleaving operation. It should be understood that a decoding process that does not involve an interleaver in the foregoing decoding process is similar to that in a conventional technology. In a decoding process that involves an interleaver, a de-interleaving operation is performed when a corresponding forward decoding encounters an interleaver, and an interleaving operation is performed when a corresponding reverse encoding encounters an interleaver.

As an example rather than a limitation, a decoding method corresponding to the encoding method in FIG. 8 is used as an example. When the to-be-decoded sequence is performed decoding, $U_1$ and $U_2$ are decoded in sequence. A decoding process of $U_1$ includes one de-interleaving corresponding to an interleaver in FIG. 8. Therefore, after $U_1$ is decoded, forward encoding needs to be performed on $U_1$ that is decoded in a decoding process of $U_2$, and the encoding process includes one interleaving corresponding to the interleaver in FIG. 8. Therefore, the decoding process in the present application may further include an interleaving operation.

It should be understood that, when the to-be-encoded sequence is performed encoding, encoding corresponding to the bits may be performed in parallel at the same time. Different from an encoding process, when the to-be-decoded sequence is performed decoding, decoding corresponding to the bits is sequentially performed in series.

Figure 10:
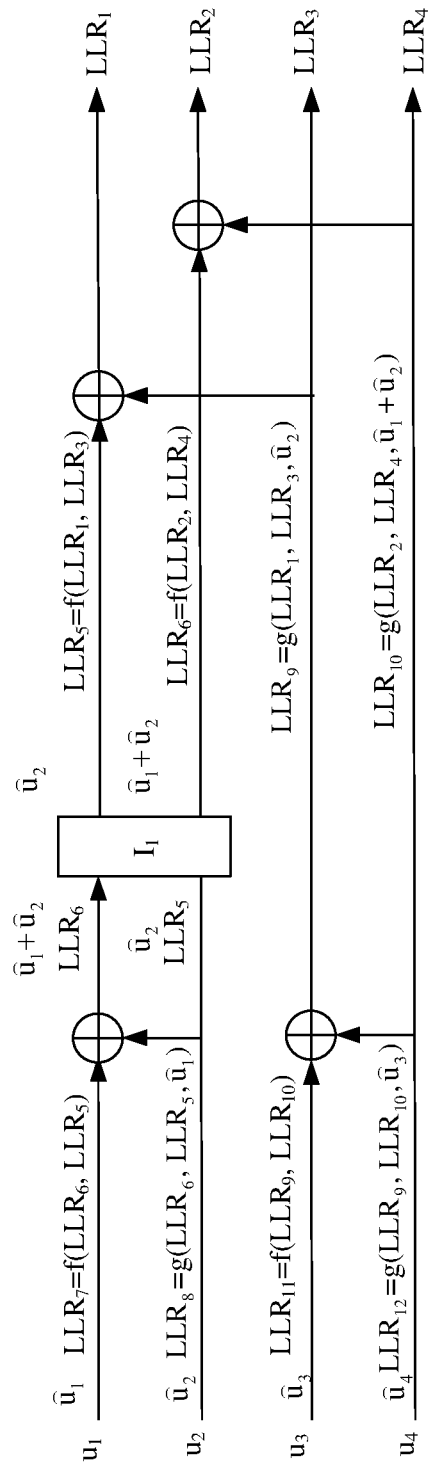
FIG. 10 is an example of a decoding method according to an embodiment of the present application.

As an example rather than a limitation, 4 bits encoding structure and an SCL decoding algorithm in FIG. 10 are used as examples, and an example in which an interleaving mode corresponding to an interleaver $I_1$ in FIG. 10 is a reverse order (which is equivalent to exchanging positions of two bits). The decoding method in the present application is further described.

According to the encoding method in the foregoing embodiments of the present application, to-be-encoded bits $u_1$, $u_2$, $u_3$, and $u_4$ are performed encoding to obtain an encoded sequence, and the encoded sequence (that is, a to-be-decoded sequence) obtained after channel transmission is performed decoding. When the to-be-decoded sequence is performed decoding, decoding results $\hat{u}_1$, $\hat{u}_2$, $\hat{u}_3$, and $\hat{u}_4$ corresponding to four bits $u_1$, $u_2$, $u_3$, and $u_4$ are decoded in sequence. A general decoding process is as follows:

Corresponding channel receiving log-likelihood ratios (LLR) are determined based on the to-be-decoded sequence, and are respectively denoted as $LLR_1$, $LLR_2$, $LLR_3$, and $LLR_4$.

An $LLR_5$ is determined based on the $LLR_1$ and the $LLR_3$, and is denoted as $LLR_5 = f(LLR_1, LLR_3)$.

An $LLR_6$ is determined based on the $LLR_2$ and the $LLR_4$, and is denoted as $LLR_6=f(LLR_2,LLR_4)$.

The $LLR_5$ and the $LLR_6$ are performed first de-interleaving (which is equivalent to exchanging positions of the $LLR_5$ and the $LLR_6$) to obtain an $LLR_6$ and an $LLR_5$, where the $LLR_5$ and the $LLR_6$ before the first de-interleaving may be referred to as first sub-sequences, and a decoding process before the first de-interleaving may be referred to as first decoding.

An $LLR_7$ is determined based on the $LLR_6$ and the $LLR_5$, and is denoted as $LLR_7=f(LLR_6,LLR_5)$.

A decoding result $\hat{u}_1$ corresponding to a first bit $u_1$ is determined based on the $LLR_7$.

An $LLR_8$ is determined based on the $LLR_6$, the $LLR_5$, and the decoding result $\hat{u}_1$, and is denoted as $LLR_8=g(LLR_6,LLR_5,\hat{u}_1)$.

A decoding result $\hat{u}_2$ corresponding to a second bit $u_2$ is determined based on the $LLR_8$.

Reverse encoding is performed on the decoding result $\hat{u}_1$ and $\hat{u}_2$: First, an exclusive OR operation is performed on $\hat{u}_1$, and $\hat{u}_2$ to obtain $\hat{u}_1+\hat{u}_2$ and $\hat{u}_2$ respectively, and then first interleaving is performed on $\hat{u}_1+\hat{u}_2$ and $\hat{u}_2$ (which is equivalent to exchanging positions of $\hat{u}_1+\hat{u}_2$ and $\hat{u}_2$) to obtain $\hat{u}_2$ and $\hat{u}_1,\hat{u}_2$ respectively.

An $LLR_9$ is determined based on the $LLR_1$, the $LLR_3$, and the $\hat{u}_2$, and is denoted as $LLR_9=g(LLR_1,LLR_3,\hat{u}_2)$.

An $LLR_{10}$ is determined based on the $LLR_2$, the $LLR_4$, and the $\hat{u}_1+\hat{u}_2$, and is denoted as $LLR_{10}=g(LLR_2,LLR_4,\hat{u}_1+\hat{u}_2)$.

An $LLR_{11}$ is determined based on the $LLR_9$ and the $LLR_{10}$, and is denoted as $LLR_{11}=f(LLR_9,LLR_{10})$.

A decoding result $\hat{u}_3$ corresponding to a third bit $u_3$ is determined based on the $LLR_{11}$.

An $LLR_{12}$ is determined based on the $LLR_9$, the $LLR_{10}$, and the decoding result $\hat{u}_3$, and is denoted as $LLR_{12}=g(LLR_9,LLR_{10},\hat{u}_3)$.

A decoding result $\hat{u}_4$ corresponding to a fourth bit $u_4$ is determined based on the $LLR_{12}$.

By now, the decoding results $\hat{u}_1$, $\hat{u}_2$, $\hat{u}_3$, and $\hat{u}_4$ corresponding to the four bits $u_1$, $u_2$, $u_3$, and $u_4$ are obtained.

It should be noted that, the foregoing decoding process after the first de-interleaving is performed on the $LLR_5$ and the $LLR_6$ (which are equivalent to the first sub-sequences) may be referred to as second decoding.

It should further be noted that, the foregoing determining manner of determining a value of the other LLR based on values of two LLRs is denoted as f, and the foregoing determining manner of determining value of the other LLR based on values of the two LLRs and a result of reverse encoding is denoted as g. A specific determining method, some specific details, and descriptions of corresponding rules are omitted in the foregoing description of the decoding process. For content omitted, refer to a specific decoding process in the SCL decoding algorithm. Details are not described herein again.

It should be understood that the foregoing description of the decoding process is merely an example based on an SCL decoding algorithm. In the present application, decoding may also be performed with reference to another decoding algorithm. For example, reference may be made to an SC decoding algorithm, the SCL decoding algorithm, an SCS decoding algorithm, and an SCH decoding algorithm. Alternatively, CRC information may be added to an information sequence, refer to an enhanced SC decoding algorithm assisted by using a CRC, for example, a CASCL decoding algorithm, a CASCS decoding algorithm, and a CASCH decoding algorithm. The present application should not be limited herein.

Figure 11:
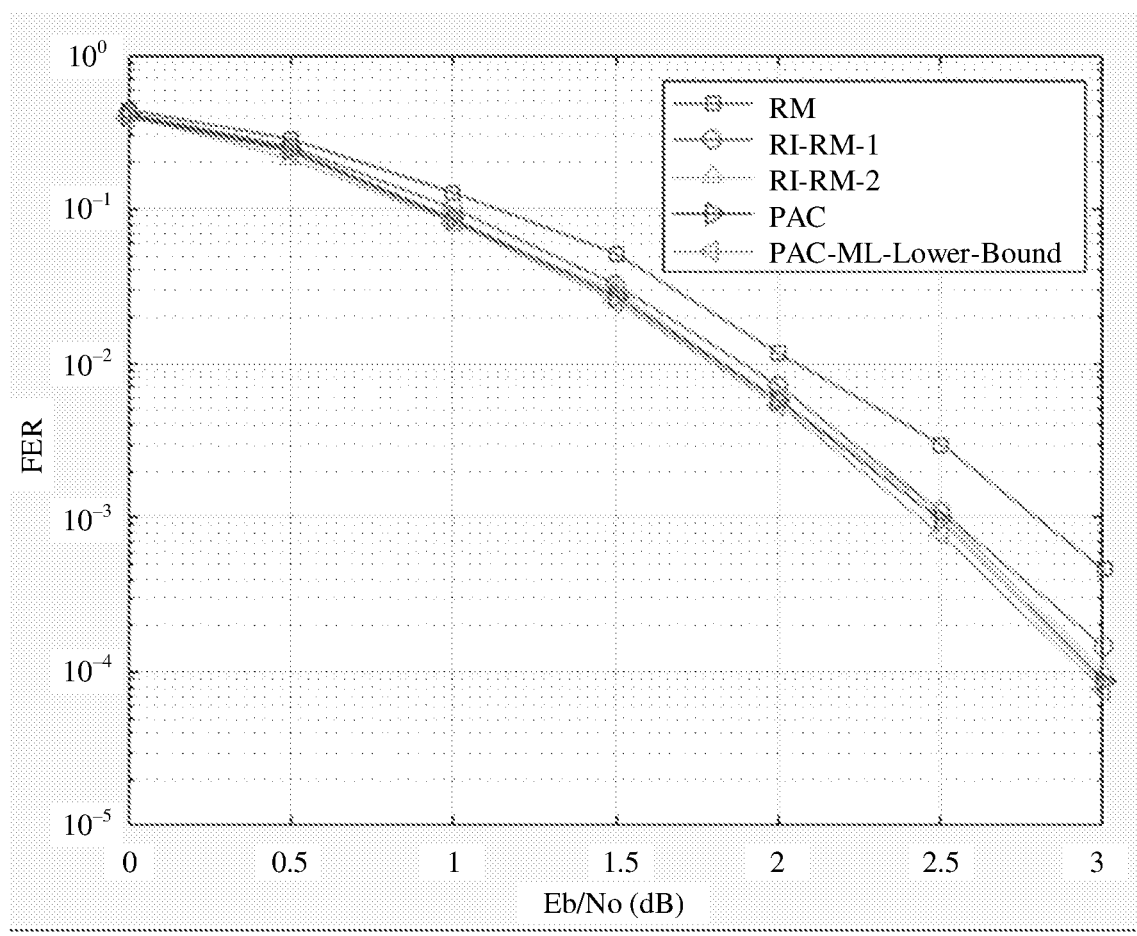
FIG. 11 is a comparison diagram of an encoding effect of an encoding method according to the present application.

FIG. 11 shows a comparison of numerical simulation results between an RI-RM-1 and RI-RM-2 encoding and decoding methods in the foregoing embodiments of the present application, an RM encoding and decoding method, a PAC encoding and decoding method in a conventional technology, and a PAC encoding and decoding method (which may be written as PAC-ML-Lower-Bound) using maximum likelihood (ML) decoding when a quantity N of code lengths of to-be-decoded bits is 128 and a quantity of information bits is 64. The ML decoding is the best decoding algorithm in the conventional technology, that is, the PAC-ML-Lower-Bound represents an optimal simulation result that can be achieved by the current PAC. The RM encoding method and the PAC encoding method use the SCL decoding algorithm. In the RI-RM-1 encoding method and the RI-RM-2 encoding method in the present application, an improved decoding algorithm based on the SCL decoding algorithm (corresponding to the encoding method in the present application) is used.

In FIG. 11, a horizontal coordinate $E_b/N_o$ represents a signal-to-noise ratio, and a vertical coordinate FER represents a frame error rate. It is not difficult to learn from FIG. 11 that, compared with a conventional RM code encoding method, when a code length is 128, and a bit rate is 1/2, the encoding method provided in the present application can bring 0.3 dB gain. Due to the addition of the interleaver, the quantity of codewords at the minimum code distance can be significantly reduced without reducing the minimum code distance, the code spectrum can be optimized, and performance of the code can be improved. Compared with a PAC encoding method, performance of a code obtained by using the encoding method provided in the present application is equivalent to performance of a PAC. In addition, compared with Fano decoding used by Arikan for the PAC, a decoding method corresponding to the encoding method in the present application has lower complexity and less difficulty in implementation.

Table 1 shows that, when a quantity N of code lengths of a to-be-encoded sequence is 128 bits and a quantity of information bits is 64 bits obtained by numerical calculation, comparisons are made between the RI-RM-1 encoding method and the RI-RM-2 encoding method in the present application and an RM encoding method, a minimum code distance of a PAC, and a quantity of codewords at the minimum code distance in a conventional technology.

TABLE 1

|  | Minimum code distance | Quantity of codewords at the minimum code distance |
| --- | --- | --- |
| RM | 16 | 94488 |
| PAC | 16 | 2776 |
| RI-RM-2 | 16 | 13864 |
| RI-RM-2 | 16 | 4664 |

It can be learned from Table 1 that, compared with a conventional RM code encoding method, in an encoding result of the RI-RM-m encoding method provided in the present application, a quantity of codewords at a minimum code distance is greatly reduced, and the minimum code distance is not reduced. This indicates that the encoding method provided in the present application optimizes an original code spectrum, and improves performance of a code. Compared with a PAC encoding method, in the RI-RM-m encoding method provided in the present application, without reducing the minimum code distance, a quantity of codewords with a minimum code distance in the encoding result obtained by using the RI-RM-m encoding method is close to a quantity of codewords with a minimum code distance in an encoding result obtained by using the PAC encoding method, and as a quantity m of times of interleaving increases, in the RI-RM-m encoding method in the present application, the quantity of codewords at the minimum code distance gradually reduces. This indicates that performance of a code generated by using the encoding method provided in the present application is equivalent to or even better than performance of a code generated by using the PAC encoding method. In addition, a decoding method corresponding to the encoding method provided in the present application has lower complexity. In other words, compared with the Fano decoding algorithm adopted by Arikan for the PAC, the decoding algorithm used in the present application is simpler, for example, an SCL decoding algorithm, an SC decoding algorithm, or a CRC-SCL decoding algorithm.

The encoding method and the decoding method provided in the present application are described in detail above with reference to FIG. 1 to FIG. 11. It should be understood that the present application provides a recursive interleaving encoding method and a decoding method. The to-be-encoded sequence is obtained based on the row weights and/or the reliability of the generator matrices, and interleaving is performed at least once in the encoding process of the to-be-encoded sequence. In other words, interleaving is performed on at least one intermediate stage in the encoding process of the to-be-encoded sequence, and correspondingly, de-interleaving is performed at least once in the decoding process of the to-be-decoded sequence. A numerical simulation result proves that, according to the encoding and decoding method provided in the present application, the minimum code distance is not reduced. In addition, a quantity of codewords with a minimum code distance can be significantly reduced, and performance of a code can be greatly improved, for example, a frame error rate can be reduced.

Based on a same technical concept, the present application further provides a corresponding communication apparatus, for example, an encoding apparatus and a decoding apparatus. The communication apparatus provided in the present application may include a one-to-one corresponding module or unit for performing the method/operation/step/action in the foregoing method embodiments. The unit may be a hardware circuit, or may be software, or may be implemented by a hardware circuit in combination with software. The following describes an encoding apparatus and a decoding apparatus provided in the present application with reference to FIG. 12 to FIG. 15.

Figure 12:
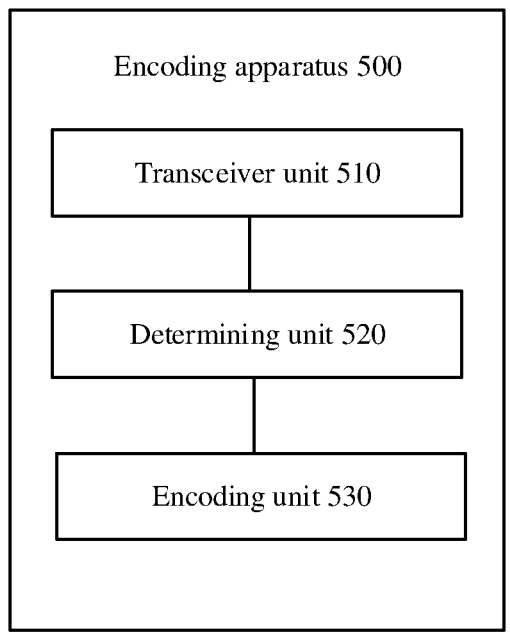
FIG. 12 is a schematic block diagram of an encoding apparatus according to an embodiment of the present application.

FIG. 12 is a schematic structural diagram of an encoding apparatus 500. The communication apparatus includes a transceiver unit 510, a determining unit 520, and an encoding unit 530.

In a possible design, the encoding apparatus 500 may implement the encoding method in embodiments shown in any one of FIG. 6 to FIG. 9.

For example, the determining unit 520 is configured to obtain a to-be-encoded sequence, where the to-be-encoded sequence includes information bits and fixed bits, and the information bits and the fixed bits are determined based on reliability corresponding to to-be-encoded bits and/or a row weight of a generator matrix.

The determining unit 520 is further configured to determine information bits and fixed bits in the to-be-encoded bits based on the reliability corresponding to the to-be-encoded bits and/or the row weights of the generator matrices, and determine the to-be-encoded sequence based on the information bits and the fixed bits. Row weights of generator matrices corresponding to the information bits are greater than or equal to row weights of generator matrices corresponding to the fixed bits.

Optionally, the row weights of the generator matrices corresponding to the information bits are greater than or equal to the row weights of the generator matrices corresponding to the fixed bits, and reliability corresponding to the information bits is greater than the preset reliability threshold.

Optionally, reliability corresponding to the information bits is greater than or equal to reliability corresponding to the fixed bits.

Optionally, reliability corresponding to the foregoing information bits is greater than or equal to reliability corresponding to the fixed bits, and row weights of generator matrices of the foregoing information bits are greater than a preset row weight threshold.

An encoding unit 530 is configured to encode the to-be-encoded sequence to obtain an encoded sequence, where an encoding process of the encoding includes at least one interleaving.

The encoding unit 530 is further configured to perform first encoding on the to-be-encoded sequence to obtain Q first encoded sequences, where Q is a positive integer; perform interleaving on at least one of the Q first encoded sequences to obtain Q second encoded sequences; and perform second encoding on the Q second encoded sequences to obtain an encoded sequence.

In a possible implementation, that the encoding unit 530 is configured to perform second encoding on the Q second encoded sequences includes: the encoding unit 530 is configured to perform third encoding on the Q second encoded sequences to obtain P third encoded sequences, where both P and Q are positive integers; perform interleaving on at least one of the P third encoded sequences to obtain P fourth encoded sequences; and perform fourth encoding on the P fourth encoded sequences to obtain an encoded sequence.

The encoding unit 530 is further configured to perform the first encoding on the to-be-encoded sequence to obtain Q first encoded sequences denoted as $\{C_1^{(0)}, C_2^{(0)}, \ldots, C_k^{(0)}, \ldots, C_Q^{(0)}\}$; perform first interleaving on Q/2 first encoded sequences $\{C_1^{(0)}, C_3^{(0)}, \ldots, C_{2k-1}^{(0)}, \ldots, C_{Q-1}^{(0)}\}$ in the Q first encoded sequences to obtain Q second encoded sequences $\{I_1^{(1)}(C_1^{(0)}), C_2, \ldots, I_k^{(1)}(C_{2k-1}^{(0)}), C_{2k}, \ldots, I_{Q/2}^{(1)}(C_{Q-1}^{(0)}), C_Q\}$, where $I_k^{(1)}$ indicates to perform first interleaving on a $k^{th}$ first encoded sequence in the Q first encoded sequences; perform third encoding on the Q second encoded sequences to obtain P third encoded sequences $\{C_1^{(1)}, C_2^{(1)}, \ldots, C_k^{(1)}, \ldots, C_P^{(1)}\}$ where k, P, and Q are all positive integers, and $C_k^{(1)}=[I_k^{(1)}(C_{2k-1}^{(0)})+C_{2k}^{(0)}, C_{2k}^{(0)}]$; perform second interleaving on P/2 third encoded sequences $\{C_1^{(1)}, C_3^{(1)}, \ldots, C_{2k-1}^{(1)}, \ldots, C_{Q-1}^{(1)}\}$ in the P third encoded sequences to obtain P fourth encoded sequences; and perform fourth encoding on the P fourth encoded sequences to obtain an encoded sequence.

The transceiver unit 510 is configured to send the encoded sequence.

Figure 13:
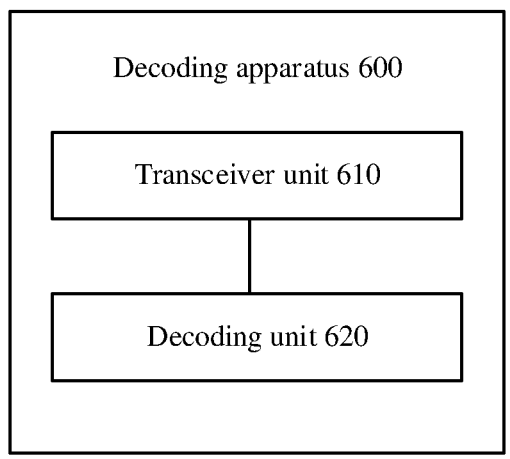
FIG. 13 is a schematic block diagram of a decoding apparatus according to an embodiment of the present application.

FIG. 13 shows a schematic structural diagram of a decoding apparatus 600. The communication apparatus includes a transceiver unit 610 and a decoding unit 620.

In a possible design, the decoding apparatus 600 may implement a decoding method corresponding to the encoding method in embodiments shown in any one of FIG. 6 to FIG. 9.

For example, the transceiver unit 610 is configured to receive a to-be-decoded sequence.

The decoding unit 620 is configured to decode the to-be-decoded sequence to obtain a decoded sequence, where a decoding process of the decoding includes at least one de-interleaving.

The decoding unit 620 is further configured to perform first decoding on the to-be-decoded sequence to obtain a first sub-sequence; perform first de-interleaving on the first sub-sequence to obtain a second sub-sequence; and perform second decoding on the second sub-sequence to obtain the decoded sequence. In a possible implementation, the encoding process before the first de-interleaving may further include one or more times of de-interleaving.

In a possible implementation, that the decoding unit 620 is configured to perform second decoding on the second sub-sequence includes: The decoding unit 620 is configured to perform third decoding on the second sub-sequence to obtain a third sub-sequence; perform second de-interleaving on the third sub-sequence to obtain a fourth sub-sequence; and perform fourth decoding on the fourth sub-sequence to obtain a decoded sequence.

Figure 14:
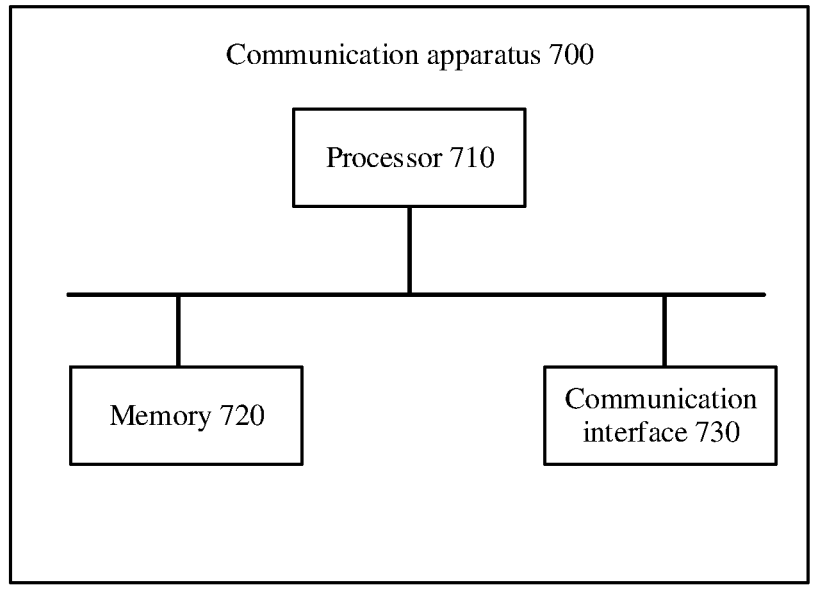
FIG. 14 is a schematic structural diagram of a communication apparatus according to an embodiment of the present application.

FIG. 14 is a structural block diagram of a communication apparatus 700 according to an embodiment of the present application. The communication apparatus 700 shown in FIG. 14 includes: a processor 710, a memory 720, and a communication interface 730. The processor 710 is coupled to the memory, and is configured to perform instructions stored in the memory, to control the communication interface 730 to send a signal and/or receive a signal.

It should be understood that the processor 710 and the memory 720 may be combined into one processing apparatus, and the processor 710 is configured to execute program code stored in the memory 720 to implement the foregoing function. During specific implementation, the memory 720 may alternatively be integrated into the processor 710, or may be independent of the processor 710.

In a possible design, the communication apparatus 700 may be the encoding apparatus or the decoding apparatus in the foregoing method embodiments, or may be a chip configured to implement functions of the encoding apparatus or the decoding apparatus in the foregoing method embodiment.

Specifically, the communication apparatus 700 may be corresponding to an encoding device or a decoding device corresponding to the encoding methods in FIG. 6 to FIG. 9 in embodiments of the present application. The communication apparatus 700 may include units configured to perform the encoding methods in FIG. 6 to FIG. 9 or decoding methods corresponding to the encoding methods. In addition, the units in the communication apparatus 700 and the foregoing other operations and/or functions are respectively corresponding procedures of the encoding method or the decoding method. It should be understood that a specific process in which the units perform the foregoing corresponding steps is described in detail in the foregoing method embodiments. For brevity, details are not described herein again.

When the communication apparatus 700 is a chip, the chip includes a transceiver unit and a processing unit. The transceiver unit may be an input/output circuit or a communication interface. The processing unit may be a processor integrated on the chip, a microprocessor, or an integrated circuit.

An embodiment of the present application further provides a processing apparatus, including a processor and an interface. The processor may be configured to perform the encoding method or the decoding method in the foregoing method embodiments.

It should be understood that the foregoing processing apparatus may be a chip. For example, the processing apparatus may be a field programmable gate array (FPGA), may be an application specific integrated circuit (ASIC), or may be a system on chip (SoC), or may be a central processor unit (CPU), or may be a network processor (NP), or may be a digital signal processor (DSP), or may be a micro controller unit (MCU), or may be a programmable logic device (PLD), or another integrated chip.

In an implementation process, steps in the foregoing methods may be implemented by using a hardware integrated logical circuit in the processor, or by using instructions in a form of software. Steps of methods disclosed with reference to embodiments of the present application may be directly performed and completed by a hardware processor, or may be performed and completed by using a combination of hardware and software modules in the processor. The software module may be located in a mature storage medium in the art, such as a random access memory, a flash memory, a read-only memory, a programmable read-only memory, an electrically erasable programmable memory, a register, or the like. The storage medium is located in the memory, and the processor reads information in the memory and completes the steps in the foregoing methods in combination with hardware of the processor. To avoid repetition, details are not described herein again.

It should be noted that the processor in this embodiment may be an integrated circuit chip, and has a signal processing capability. In an implementation process, the steps in the foregoing method embodiments may be completed by using an integrated logic circuit of hardware in the processor or an instruction in a form of software. The foregoing processor may be a general-purpose processor, a digital signal processor (DSP), an application-specific integrated circuit (ASIC), a field programmable gate array (FPGA), or another programmable logic device, a discrete gate or a transistor logic device, or a discrete hardware component. The methods, steps, and logical block diagrams disclosed in embodiments of the present application may be implemented or performed. The general-purpose processor may be a microprocessor, or the processor may be any conventional processor, or the like. Steps of the methods disclosed with reference to embodiments of the present application may be directly performed and completed by using a hardware decoding processor, or may be performed and completed by using a combination of hardware and software modules in the decoding processor. The software module may be located in a mature storage medium in the art, such as a random access memory, a flash memory, a read-only memory, a programmable read-only memory, an electrically erasable programmable memory, a register, or the like. The storage medium is located in the memory, and the processor reads information in the memory and completes the steps in the foregoing methods in combination with hardware of the processor.

It may be understood that the memory in embodiments of the present application may be a volatile memory or a non-volatile memory, or may include a volatile memory and a non-volatile memory. The non-volatile memory may be a read-only memory (ROM), a programmable read-only memory (programmable ROM, PROM), an erasable programmable read-only memory (erasable PROM, EPROM), an electrically erasable programmable read-only memory (electrically EPROM, EEPROM), or a flash memory. The volatile memory may be a random access memory (RAM) and is used as an external cache. Through illustrative but not limited description, many forms of RAMs may be used, for example, a static random access memory (static RAM, SRAM), a dynamic random access memory (dynamic RAM, DRAM), a synchronous dynamic random access memory (synchronous DRAM, SDRAM), a double data rate synchronous dynamic random access memory (double data rate SDRAM, DDR SDRAM), an enhanced synchronous dynamic random access memory (enhanced SDRAM, ESDRAM), a synchronous link dynamic random access memory (synch-link DRAM, SLDRAM), and a direct rambus random access memory (direct ram-bus RAM, DR RAM). It should be noted that the memory in the systems and methods described in this specification includes but is not limited to memories of these and any other appropriate types.

Figure 15:
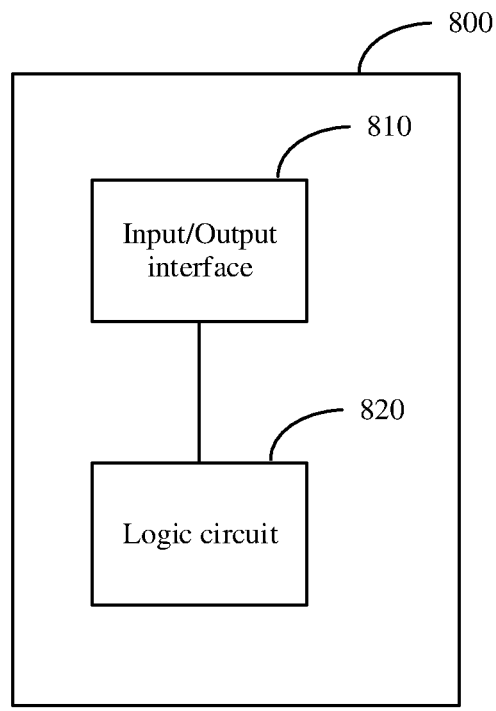
FIG. 15 is a schematic structural diagram of another communication apparatus according to an embodiment of the present application.

Refer to FIG. 15, an embodiment of the present application further provides an apparatus 800, which may be configured to implement functions of the encoding apparatus or the decoding apparatus in the foregoing method. The apparatus 800 may be a communication apparatus or a chip in the communication apparatus. The communication apparatus includes:

at least one input/output interface 810 and a logic circuit 820. The input/output interface 810 may be an input/output circuit, or may be referred to as a communication interface. The logic circuit 820 may be a signal processor, a chip, or another integrated circuit that can implement the method in the present application.

The at least one input/output interface 810 is configured to input or output a signal or data. For example, when the apparatus is an encoding apparatus or is used for an encoding apparatus, the input/output interface 810 is configured to obtain a to-be-encoded sequence, and the input/output interface 810 is further configured to send an encoded sequence. For example, when the apparatus is a decoding apparatus or is used for a decoding apparatus, the input/output interface 810 is configured to obtain a to-be-decoded sequence.

The logic circuit 820 is configured to perform a part or all of the steps in any one of the methods provided in embodiments of the present application. The logic circuit may implement functions implemented by the determining unit 520 and the encoding unit 530 in the encoding apparatus 500, the decoding unit 620 in the decoding apparatus 600, and the processor 710 in the communication apparatus 700. For example, when the apparatus is an encoding apparatus or is used for an encoding apparatus, the apparatus is configured to perform steps performed by the encoding apparatus in various possible implementations in the foregoing method embodiments. For example, the logic circuit 820 is configured to encode the to-be-encoded sequence to obtain the encoded sequence according to the encoding methods in various possible implementations in the foregoing method embodiments. When the apparatus is a decoding apparatus or is used for a decoding apparatus, the apparatus is configured to perform steps performed by the decoding apparatus in various possible implementations in the foregoing method embodiments. For example, the logic circuit 820 is configured to decode the to-be-decoded sequence to obtain the decoded sequence according to the decoding methods in various possible implementations in the foregoing method embodiments.

When the foregoing communication apparatus is a chip applied to the encoding apparatus, the chip implements a function of the encoding apparatus in the foregoing method embodiments. The chip receives information from another module (for example, a radio frequency module or an antenna) in the encoding apparatus. Alternatively, the chip sends information to another module (such as a radio frequency module or an antenna) in the encoding apparatus. The information is sent by the encoding apparatus to the decoding apparatus.

When the foregoing communication apparatus is a chip applied to the decoding apparatus, the chip implements a function of the decoding apparatus in the foregoing method embodiments. The chip receives information from another module (for example, a radio frequency module or an antenna) in the decoding apparatus. The information is sent by the encoding apparatus to the decoding apparatus. Alternatively, the chip sends information to another module (such as a radio frequency module or an antenna) in the decoding apparatus.

According to the method provided in embodiments of the present application, the present application further provides a computer program product. The computer program product includes: computer program code. When the computer program code is run on a computer, the computer is enabled to perform the encoding method in any one of embodiments shown in FIG. 6 and FIG. 9 or the decoding method corresponding to the encoding method.

According to the method provided in embodiments of the present application, the present application further provides a computer-readable medium. The computer-readable medium stores program code. When the program code is run on a computer, the computer is enabled to perform the encoding method in any one of embodiments shown in FIG. 6 and FIG. 9 or the decoding method corresponding to the encoding method.

According to the methods provided in embodiments of the present application, the present application further provides a system. The system includes the foregoing apparatus or device.

All or a part of the foregoing embodiments may be implemented by software, hardware, firmware, or any combination thereof. When software is used to implement embodiments, all or a part of embodiments may be implemented in a form of a computer program product. The computer program product includes one or more computer instructions. When the computer instructions are loaded and executed on the computer, the procedures, or functions based on embodiments of the present application are all or partially generated. The computer may be a general-purpose computer, a dedicated computer, a computer network, or any other programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium (for example, a floppy disk, a hard disk, or a magnetic tape), an optical medium. (for example, a high-density digital video disc (DVD)), or a semiconductor medium (for example, a solid state disk (SSD)), or the like.

Terms such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both an application and a computing device that runs on the computing device may be components. One or more components may reside within a process and/or a thread of execution, and a component may be located on one computer and/or distributed between two or more computers. In addition, these components may be executed from various computer-readable media that store various data structures. For example, the components may communicate by using a local and/or remote process and according to, for example, a signal having one or more data packets (for example, data from two components interacting with another component in a local system, a distributed system, and/or across a network such as the Internet interacting with other systems by using the signal).

The encoding apparatus and the decoding apparatus in the foregoing apparatus embodiments correspond to the encoding method and the decoding method in the method embodiments, and a corresponding module or unit performs a corresponding step. For example, a communication unit (communication interface) performs a receiving or sending step in the method embodiments. Other steps other than sending and receiving may be performed by a processing unit (processor). For a function of a specific unit, refer to a corresponding method embodiment. There may be one or more processors.

It should be further understood that the term "and/or" in this specification is merely an association relationship for describing an associated object, and represents that three relationships may exist. For example, A and/or B may represent the following three cases: Only A exists, both A and B exist, and only B exists. In addition, the character "/" in this specification generally represents an "or" relationship between the associated objects.

It should be further understood that, in embodiments of the present application, numbers "first", "second", "third", "fourth", and the like are introduced only to distinguish different objects, for example, distinguish different "processing processes", "encoding sequences", or "sub-sequences". An understanding of a specific object and a correspondence between different objects should be determined based on a function and internal logic of the specific object, and should not be construed as any limitation on an implementation process of embodiments of the present application.

A person of ordinary skill in the art may be aware that, in combination with the examples described in embodiments disclosed in this specification, units and algorithm steps can be implemented by electronic hardware or a combination of computer software and electronic hardware. Whether the functions are performed by hardware or software depends on particular applications and design constraints of the technical solutions. A person skilled in the art may use different methods to implement the described functions of each particular application, but it should not be considered that the implementation goes beyond the scope of the present application.

It may be clearly understood by a person skilled in the art that, for convenient and brief description, for a detailed working process of the foregoing system, apparatus, and units, refer to a corresponding process in the foregoing method embodiments, and details are not described herein again.

In the several embodiments provided in the present application, it should be understood that the disclosed systems, apparatuses, and methods may be implemented in other manners. For example, the described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in an electronic form, a mechanical form, or another form.

The units described as separate parts may or may not be physically separate, and parts displayed as units may or may not be physical units, in other words, may be located at one position, or may be distributed on a plurality of network units. Some or all of the units may be selected based on actual requirements to achieve the objectives of solutions of embodiments.

In addition, functional units in embodiments of the present application may be integrated into one processing unit, or each of the units may exist alone physically, or two or more units are integrated into one unit.

The foregoing descriptions are merely specific implementations of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. An encoding method, comprising:
   obtaining a sequence for encoding, wherein the sequence corresponds to bits for encoding, the bits for encoding comprise information bits carrying target information and fixed bits carrying preset information, and the information bits and the fixed bits are determined based on reliability and/or row weights of generator matrices corresponding to the bits for encoding; and
   performing an encoding process on the sequence to obtain an encoded sequence, wherein the encoding process comprises at least one interleaving process.

2. The encoding method according to claim 1, wherein the encoding process comprises:
   performing a first encoding process on the sequence for encoding to obtain Q first encoded sequences, wherein Q is a positive integer;
   performing a first interleaving process on at least one of the Q first encoded sequences to obtain Q second encoded sequences; and
   performing a second encoding process on the Q second encoded sequences to obtain the encoded sequence.

3. The encoding method according to claim 2, wherein the second encoding process comprises:
   performing a third encoding process on the Q second encoded sequences to obtain P third encoded sequences, wherein both P and Q are positive integers;

performing a second interleaving process on at least one of the P third encoded sequences to obtain P fourth encoded sequences; and performing a fourth encoding process on the P fourth encoded sequences to obtain the encoded sequence.

4. The encoding method according to claim 1, wherein the encoding process comprises:

performing a first encoding process on the sequence to obtain Q first encoded sequences denoted as $\{C_1^{(0)}, C_2^{(0)}, \ldots, C_k^{(0)}, \ldots, C_Q^{(0)}\}$;

performing a first interleaving process on Q/2 first encoded sequences $\{C_1^{(0)}, C_3^{(0)}, \ldots, C_{2k-1}^{(0)}, \ldots, C_{Q-1}^{(0)}\}$ in the Q first encoded sequences to obtain Q second encoded sequences $\{I_1^{(1)}(C_1^{(0)}), C_2, \ldots, I_k^{(1)}(C_{2k-1}^{(0)}), C_{2k}, \ldots, I_{Q/2}^{(1)}(C_{Q-1}^{(0)}), C_Q\}$, wherein $I_k^{(1)}$ indicates to perform first interleaving on a $k^{th}$ first encoded sequence in the Q first encoded sequences;

performing a third encoding process on the Q second encoded sequences to obtain P third encoded sequences $\{C_1^{(1)}, C_2^{(1)}, \ldots, C_k^{(1)}, \ldots, C_P^{(1)}\}$, wherein k, P, and Q are all positive integers, and $C_k^{(1)} = [I_k^{(1)}(C_{2k-1}^{(0)}) + C_{2k}^{(0)}, C_{2k}^{(0)}]$;

performing a second interleaving process on P/2 third encoded sequences $\{C_1^{(1)}, C_3^{(1)}, \ldots, C_{2k-1}^{(1)}, \ldots, C_{Q-1}^{(1)}\}$ in the P third encoded sequences to obtain P fourth encoded sequences; and performing a fourth encoding process on the P fourth encoded sequences to obtain the encoded sequence.

5. The encoding method according to claim 1, wherein the encoding process comprises: performing first encoding on the sequence to obtain Q first encoded sequences denoted as $\{C_1^{(0)}, C_2^{(0)}, \ldots, C_k^{(0)}, \ldots, C_Q^{(0)}\}$, wherein k and Q are positive integers;

performing a first interleaving process on Q/2 first encoded sequences $\{C_1^{(0)}, C_2^{(0)}, \ldots, C_k^{(0)}, \ldots, C_Q^{(0)}\}$ in the Q first encoded sequences to obtain Q second encoded sequences denoted as $\{I_1^{(1)}(C_1^{(0)}), C_2, \ldots, I_k^{(1)}(C_{2k-1}^{(0)}), C_{2k}, \ldots, I_{Q/2}^{(1)}(C_{Q-1}^{(0)}), C_Q\}$, wherein $I_k^{(1)}$ indicates to perform first interleaving on a $k^{th}$ first encoded sequence in the Q first encoded sequences; and performing a second encoding process on the Q second encoded sequences to obtain the encoded sequence.

6. The encoding method according to claim 2, wherein the first encoding process comprises: performing equivalent grouping on the sequence, equivalently treating the sequence as Q groups of sub-sequences, and performing an encoding process before a first interleaving process on the Q groups of sub-sequences.

7. The encoding method according to claim 6, wherein the performing equivalent grouping on the sequence comprises:

performing equivalent grouping on the sequence based on a predetermined number m of interleaving processes.

8. The encoding method according to claim 2, wherein the encoding process before the first interleaving process further comprises one or more interleaving processes.

9. The encoding method according to claim 2, wherein the second encoding process comprises: performing next-stage encoding on the Q interleaved second encoded sequences.

10. The encoding method according to claim 1, wherein row weights of generator matrices corresponding to the information bits are greater than or equal to row weights of generator matrices corresponding to the fixed bits.

11. The encoding method according to claim 10, wherein reliability corresponding to the information bits is greater than a reliability threshold.

12. The encoding method according to claim 10, further comprising:

calculating a row weight of a generator matrix corresponding to each of bits for encoding; and sorting the bits for encoding in descending order of the row weights of the generator matrices, and selecting first K bits as the information bits, and other bits as the fixed bits; or sorting the bits for encoding in ascending order of the row weights of the generator matrices, and selecting last K bits as the information bits, and other bits as the fixed bits, wherein a quantity K of the information bits is preset.

13. The encoding method according to claim 11, further comprising:

selecting, from the bits for encoding, a bit whose reliability is greater than the reliability threshold;

determining row weights of generator matrices corresponding to bits whose reliability is greater than the reliability threshold; and sorting, in descending order of the row weights of the generator matrices, the bits whose reliability is greater than the reliability threshold, and selecting first K bits as the information bits, and other bits as the fixed bits; or sorting, in ascending order of the row weights of the generator matrices, the bits whose reliability is greater than the reliability threshold, and selecting last K bits as the information bits, and other bits as the fixed bits, wherein a quantity K of the information bits is preset.

14. The encoding method according to claim 11, further comprising:

calculating reliability corresponding to each of the bits for encoding;

sorting the bits for encoding in descending order of the reliability or ascending order of the reliability;

selecting M bits based on the reliability threshold or a sequence number of the reliability corresponding to each of the M bits; and selecting K bits from the M bits as the information bits based on a sequence number of a row weight of a generator matrix corresponding to each of the bits for encoding, wherein M is greater than or equal to K, and both M and K are positive integers.

15. The encoding method according to claim 1, wherein reliability corresponding to the information bits is greater than or equal to reliability corresponding to the fixed bits.

16. The encoding method according to claim 15, further comprising:

calculating reliability of a sub-channel corresponding to each of the bits for encoding; and sorting the bits for encoding in descending order of the reliability, and selecting first K bits as the information bits, and other bits as the fixed bits; or sorting the bits for encoding in ascending order of the reliability, and selecting last K bits as the information bits, and other bits as the fixed bits, wherein a quantity K of the information bits is preset.

17. The encoding method according to claim 1, wherein reliability corresponding to the information bits is greater than or equal to reliability corresponding to the fixed bits, and row weights of generator matrices corresponding to the information bits are greater than a row weight threshold.

18. The encoding method according to claim 17, further comprising:

selecting, from the bits for encoding, bits in which row weights of the generator matrices are greater than the row weight threshold;

determining reliability corresponding to the bits in which the row weights of the generator matrices are greater than the row weight threshold; and sorting, in descending order of the reliability, the bits in which the row weights of the generator matrices are greater than the row weight threshold, and selecting first K bits as the information bits, and other bits as the fixed bits; or sorting, in descending order of the reliability or ascending order of the reliability, the bits in which the row weights of the generator matrices are greater than the row weight threshold, and selecting last K bits as the information bits, and other bits as the fixed bits, wherein a quantity K of the information bits is preset.

19. An encoding apparatus, comprising at least one processor and a memory storing instructions that, when executed by the at least one processor, cause the encoding apparatus to:

obtain a sequence for encoding, wherein the sequence corresponds to bits for encoding, the bits for encoding comprise information bits caring target information and fixed bits carrying preset information, and the information bits and the fixed bits are determined based on reliability and/or row weights of generator matrices corresponding to the bits for encoding; and perform an encoding process on the sequence for encoding to obtain an encoded sequence, wherein the encoding process comprises at least one interleaving process.

20. A decoding method comprising:

receiving a sequence for decoding, wherein the sequence for decoding are encoded based on a sequence corresponding to information bits carrying target information and fixed bits carrying preset information, and the information bits and the fixed bits are determined based on reliability and/or row weights of generator matrices corresponding to the information bits and the fixed bits; and performing a decoding process on the sequence to obtain a decoded sequence, wherein the decoding process comprises at least one de-interleaving process between two decoding processes.

* * * * *

UNITED STATES PATENT AND TRADEMARK OFFICE
CERTIFICATE OF CORRECTION

| | | |
|---|---|---|
| PATENT NO. | : 12,476,656 B2 | Page 1 of 1 |
| APPLICATION NO. | : 18/463404 | |
| DATED | : November 18, 2025 | |
| INVENTOR(S) | : Bin Li | |

It is certified that error appears in the above-identified patent and that said Letters Patent is hereby corrected as shown below:

In the Claims

Column 41, Claim 19, Line 21, change "caring" to --carrying--.

Signed and Sealed this
Sixteenth Day of December, 2025

John A. Squires
*Director of the United States Patent and Trademark Office*